(12) United States Patent
Ku

(10) Patent No.: US 11,669,196 B2
(45) Date of Patent: Jun. 6, 2023

(54) FOLDABLE DISPLAY DEVICE HAVING A TOUCH SENSOR IN A FOLDABLE AREA

(71) Applicant: Samsung Display Co., Ltd., Yongin-si (KR)

(72) Inventor: Ja Seung Ku, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/682,728

(22) Filed: Feb. 28, 2022

(65) Prior Publication Data

US 2022/0179539 A1 Jun. 9, 2022

Related U.S. Application Data

(63) Continuation of application No. 17/099,641, filed on Nov. 16, 2020, now Pat. No. 11,262,866.

(30) Foreign Application Priority Data

Mar. 31, 2020 (KR) ........................ 10-2020-0038841

(51) Int. Cl.
*G06F 3/041* (2006.01)
*G06F 3/044* (2006.01)
(Continued)

(52) U.S. Cl.
CPC ........ *G06F 3/04164* (2019.05); *G06F 3/0443* (2019.05); *G06F 3/0446* (2019.05);
(Continued)

(58) Field of Classification Search
CPC . G06F 2203/04102; G06F 2203/04111; G06F 2203/04112; G06F 3/04164;
(Continued)

(56) References Cited

U.S. PATENT DOCUMENTS 10,353,565 B2 7/2019 Zadesky et al.
10,797,251 B2 10/2020 Kwon et al.
(Continued)

FOREIGN PATENT DOCUMENTS

CN 204143398 2/2015
KR 10-2012-0094984 8/2012
KR 10-2018-0032262 3/2018

OTHER PUBLICATIONS

Non-Final Office Action dated Jul. 9, 2021, in U.S. Appl. No. 17/099,641.

(Continued)

*Primary Examiner* — Chun-Nan Lin
(74) *Attorney, Agent, or Firm* — H.C. Park & Associates, PLC

(57) ABSTRACT

A display device includes: a first base member configured to be folded or unfolded along a folding axis and including a display area including a first display area disposed on one side of the folding axis, a second display area disposed on another side of the folding axis, and a third display area through which the folding axis passes; and a plurality of first sensing electrodes and a plurality of second sensing electrodes disposed in each of the first display area, the second display area, and the third display area on the first base member. Each of the plurality of first sensing electrodes and each of the plurality of second sensing electrodes are spaced apart from each other based on the folding axis interposed therebetween.

20 Claims, 15 Drawing Sheets

(51) Int. Cl.
*H01L 27/32* (2006.01)
*H01L 51/00* (2006.01)

(52) U.S. Cl.
CPC ........ *H01L 27/323* (2013.01); *H01L 27/3244* (2013.01); *H01L 51/0097* (2013.01); *G06F 2203/04102* (2013.01); *G06F 2203/04111* (2013.01); *H01L 2251/5338* (2013.01)

(58) Field of Classification Search
CPC .... G06F 3/0418; G06F 3/0443; G06F 3/0446; H01L 2251/5338; H01L 27/323; H01L 27/3244; H01L 51/0097; Y02E 10/549
See application file for complete search history.

(56) References Cited

U.S. PATENT DOCUMENTS

| | | |
|---|---|---|
| 10,884,568 B2 | 1/2021 | Seo et al. |
| 2016/0239133 A1 | 8/2016 | Ko et al. |
| 2018/0004322 A1* | 1/2018 | Nakanishi ............ H05K 9/0096 |
| 2018/0081219 A1* | 3/2018 | Kim ...................... G06F 1/1652 |
| 2018/0097197 A1* | 4/2018 | Han ......................... H05K 5/03 |
| 2021/0012687 A1 | 1/2021 | Li et al. |
| 2021/0043701 A1* | 2/2021 | Li ........................ G09G 3/3233 |

OTHER PUBLICATIONS

Notice of Allowance dated Oct. 20, 2021, in U.S. Appl. No. 17/099,641.

Corrected Notice of Allowance dated Nov. 4, 2021, in U.S. Appl. No. 17/099,641.

\* cited by examiner

FOLDABLE DISPLAY DEVICE HAVING A TOUCH SENSOR IN A FOLDABLE AREA

CROSS REFERENCE TO RELATED APPLICATION

This application is a Continuation of U.S. patent application Ser. No. 17/099,641, filed on Nov. 16, 2020, which claims priority from and the benefit of Korean Patent Application No. 10-2020-0038841, filed on Mar. 31, 2020, each of which is hereby incorporated by reference for all purposes as if fully set forth herein.

BACKGROUND

Field

Exemplary implementations of the invention relate generally to a display device and more specifically, to a display device having a touch sensor in a foldable area.

Discussion of the Background

With the development of an information society, demands for display devices for displaying images have increased in various technical fields. For example, display devices are applied to various electronic products such as smart phones, digital cameras, notebook computers, navigators, and smart televisions. A display device may be a flat panel display device such as a liquid crystal display device, a field emission display device, or a light emitting display device. Since the light emitting display device, among flat panel display devices, includes light emitting elements by which each of the pixels in a display panel emits light by itself, it may display an image without a backlight unit for providing light to the display panel.

Recently, a touch sensing unit recognizing a touch input has been widely used as an input device of a display device in the fields of smart phones or tablet PCs. The touch sensing unit determines a user's touch input, and calculates the corresponding position as touch input coordinates. The touch sensing unit may include first touch electrodes and second touch electrodes. In this case, unnecessary electrical coupling may occur between the first touch electrodes and the second touch electrodes, and thus the sensitivity of the touch sensing unit may be deteriorated or the driving of the touch sensing unit may be impossible.

The above information disclosed in this Background section is only for understanding of the background of the inventive concepts, and, therefore, it may contain information that does not constitute prior art.

SUMMARY

Applicant realized that the electrical interference between driving electrodes and sensing electrodes of a touch sensor of a display device may easily occur when the display device is folded or unfolded.

Display devices constructed according to the principles of exemplary implementations of the invention are capable of preventing the electrical interference between the driving electrodes and the sensing electrodes of the touch sensor, which are arranged on both sides of the folding axis, and improving the touch sensitivity of the touch sensor by providing some driving electrodes disposed at one side of a folding axis driven by a first touch driver, other driving electrodes disposed at the other side of the folding axis driven by a second touch driver, and metal lines between the some driving electrodes and the other driving electrodes.

In addition, display devices constructed according to the principles of exemplary implementations of the invention are capable of preventing the interference between a plurality of driving electrodes and a plurality of sensing electrodes arranged in a foldable area and improving touch sensitivity.

Additional features of the inventive concepts will be set forth in the description which follows, and in part will be apparent from the description, or may be learned by practice of the inventive concepts.

According to one or more implementations of the invention, a display device includes: a first base member configured to be folded or unfolded along a folding axis and including a display area including a first display area disposed on one side of the folding axis, a second display area disposed on another side of the folding axis, and a third display area through which the folding axis passes; and a plurality of first sensing electrodes and a plurality of second sensing electrodes disposed in each of the first display area, the second display area, and the third display area on the first base member, wherein each of the plurality of first sensing electrodes and each of the plurality of second sensing electrodes are spaced apart from each other based on the folding axis interposed therebetween.

The first base member may further include: a first pad unit disposed at one side of the first base member and connected to each of the plurality of first sensing electrodes and each of the plurality of second sensing electrodes arranged on one side of the folding axis; and a second pad unit disposed at another side of the first base member and connected to each of the plurality of first sensing electrodes and each of the plurality of second sensing electrodes arranged on another side of the folding axis.

The display device may further include: a first touch driver connected to the first pad unit to drive the plurality of first sensing electrodes and the plurality of second sensing electrodes connected to the first pad unit; and a second touch driver connected to the second pad unit to drive the plurality of first sensing electrodes and the plurality of second sensing electrodes connected to the second pad unit.

The plurality of first sensing electrodes may be spaced apart from each other in a first direction and a second direction substantially perpendicular to the first direction, and the plurality of second sensing electrodes may extend in the first direction and may be spaced apart from each other in the second direction.

The display device may further include: a connection electrode disposed in a different layer from the plurality of first sensing electrodes and the plurality of second sensing electrodes and connecting the plurality of first sensing electrodes spaced apart from each other in the second direction.

The display device may further include: a first driving line connecting the plurality of first sensing electrodes disposed at one end of the display area to the first pad unit; a second driving line connecting the plurality of first sensing electrodes disposed at another end of the display area to the second pad unit; a first sensing line disposed at another end adjacent to the one end of the display area and connecting the plurality of second sensing electrodes disposed on the one side of the folding axis to the first pad unit; and a second sensing line disposed at another end adjacent to the another end of the display area and connecting the plurality of second sensing electrodes disposed on the another side of the folding axis to the second pad unit.

The third display area may further include a metal line disposed between the plurality of first sensing electrodes connected to the first driving line and the plurality of first sensing electrodes connected to the second driving line.

The metal line may be grounded through a ground pad unit adjacent to the first pad unit.

A facing area of the plurality of first sensing electrodes spaced apart from each other and adjacent to the folding axis interposed therebetween may be larger than a facing area of the plurality of second sensing electrodes spaced apart from each other and adjacent to the folding axis interposed therebetween.

The plurality of second sensing electrodes may include: a second-first sensing electrode disposed on the one side of the folding axis and closest to the folding axis; a second-second sensing electrode disposed at one side of the second-first sensing electrode; and a second-third sensing electrode disposed on the another side of the folding axis and closest to the folding axis, wherein a distance between the second-first sensing electrode and the second-second sensing electrode may be substantially equal to a distance between the second-first sensing electrode and the second-third sensing electrode.

The plurality of first sensing electrodes may extend in a first direction and may be spaced apart from each other in a second direction substantially perpendicular to the first direction, and the plurality of second sensing electrodes may be spaced apart from each other in the first direction and the second direction.

The display device may further include: a connection electrode disposed in a different layer from the plurality of first sensing electrodes and the plurality of second sensing electrodes and connecting the plurality of second sensing electrodes spaced apart from each other in the second direction.

The display device may further include: a first sensing line connecting the plurality of second sensing electrodes disposed at one end of the display area to the first pad unit; a second sensing line connecting the plurality of second sensing electrodes disposed at another end of the display area to the second pad unit; a first driving line disposed at another end adjacent to the one end of the display area and connecting the plurality of first sensing electrodes disposed on the one side of the folding axis to the first pad unit; and a second driving line disposed at another end adjacent to the another end of the display area and connecting the plurality of first sensing electrodes disposed on the another side of the folding axis to the second pad unit.

A facing area of the plurality of second sensing electrodes spaced apart from each other and adjacent to the folding axis interposed therebetween may be larger than a facing area of the plurality of first sensing electrodes spaced apart from each other and adjacent to the folding axis interposed therebetween.

The plurality of first sensing electrodes may include: a first driving electrode disposed on the one side of the folding axis and closest to the folding axis; a second driving electrode disposed at one side of the first driving electrode; and a third driving electrode disposed on the another side of the folding axis and closest to the folding axis, wherein a distance between the first driving electrode and the second driving electrode may be substantially equal to a distance between the first driving electrode and the third driving electrode.

The display device may further include: a display layer including a plurality of pixels arranged in the display area on the first base member; and a sensing electrode layer including the plurality of first sensing electrodes and the plurality of second sensing electrodes on the display layer.

The display device may further include: a circuit board connected to the first pad unit disposed at the one side of the first base member; a first touch driver disposed on the circuit board and connected to the first pad unit; a flexible film connected to the second pad unit disposed at the another side of the first base member; and a second touch driver disposed on the flexible film and connected to the second pad unit.

The display device may further include: a display layer including a plurality of pixels arranged in the display area on the first base member; a second base member covering the display layer; an adhesive member disposed at edges of the first base member and the second base member to surround the display layer; and a sensing electrode layer including the plurality of first sensing electrodes and the plurality of second sensing electrodes on the second base member.

The display device may further include: a circuit board connected to the first pad unit disposed at the one side of the first base member; a first touch driver disposed on the circuit board and connected to the first pad unit; a flexible film connected to the second pad unit disposed at one side of the second base member; and a second touch driver disposed on the flexible film and connected to the second pad unit.

The display device may further include: a dummy pattern surrounded by the plurality of first sensing electrodes or the plurality of second sensing electrodes and insulated from the plurality of first sensing electrodes and the plurality of second sensing electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
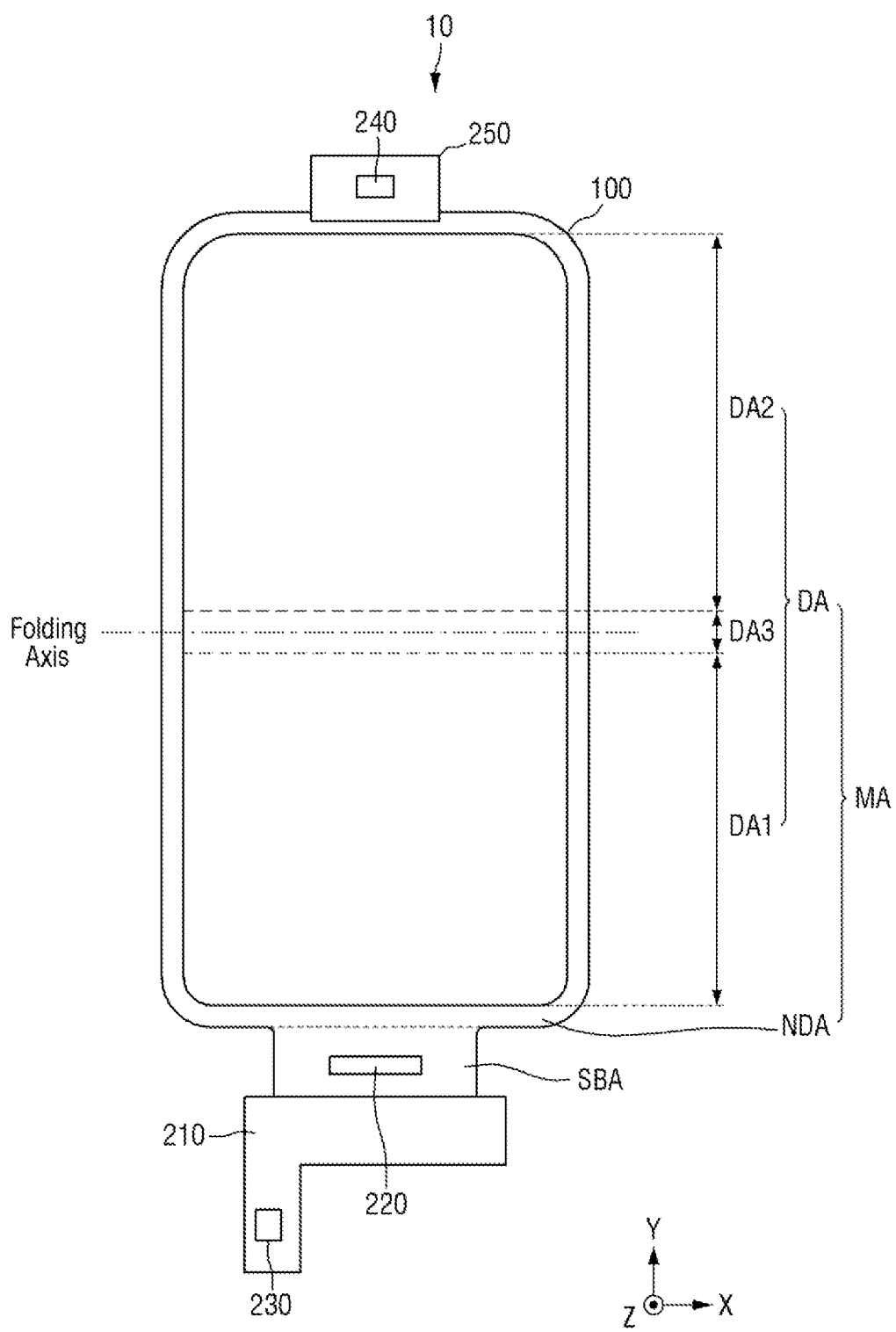
FIG. 1 is a plan view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of an embodiment of a display device constructed according to the principles of the invention.

Referring to FIG. 1, a display device 10 may be applied to portable electronic products such as a mobile phone, a smart phone, a tablet personal computer (tablet PC), a mobile communication terminal, an electronic notebook, an e-book, a portable multimedia player (PMP), a navigator, or an ultra mobile PC (UMPC). For example, the display device 10 may be applied to a display unit of a television, a notebook, a monitor, a billboard, or internet of things (IOT). Further, the display device 10 may be applied to a wearable device such as a smart watch, a watch phone, an eyeglass display, or a head mounted display (HMD). Furthermore, the display device 10 may be applied to a center information display (CID) placed in a car instrument panel, a car center fascia or a carbon dashboard, a room mirror display for replacing a car side mirror, or a display placed on the back surface of a front seat as an entertainment for a back seat of a car.

In the following descriptions, the first direction (X-axis direction) is a direction in parallel to short sides of the display device 10 (e.g., a horizontal/width direction of the display device 10). The second direction (Y-axis direction) is a direction in parallel to long sides of the display device 10 (e.g., a vertical/length direction of the display device 10). The third direction (Z-axis direction) may be a thickness direction of the display device 10.

The display device 10 may have a substantially rectangular shape in a plan view. For example, as shown in FIG. 1, the display device 10 may have a rectangular shape having short sides in the first direction (X-axis direction) and long sides in the second direction (Y-axis direction). The corner where the short side in the first direction (X-axis direction) meets the long side in the second direction (Y-axis direction) may be formed to have a round shape with a predetermined curvature or a right angle shape. The shape of the display device 10 in a plan view is not limited to a rectangular shape, and may be formed in a similar shape to another polygonal shape, circular shape, or elliptical shape.

The display device 10 includes a display panel 100, a circuit board 210, a display driver 220, a first touch driver 230, a second touch driver 240, and a flexible film 250.

The display panel 100 may be a light emitting display panel including a light emitting element. For example, the display panel 100 may be an organic light emitting display panel including an organic light emitting diode having an organic light emitting layer, a micro LED display panel using a micro LED, a quantum dot light emitting display panel including a quantum dot light emitting diode having a quantum dot light emitting layer, or an inorganic light emitting display panel including an inorganic light emitting element having an inorganic semiconductor.

For example, the display panel 100 may be a flexible display panel that can be easily bent, folded, or rolled due to its flexibility. For example, the display panel 100 may include a flexible portion having flexibility and a rigid portion that is not easily bent due to its rigidity. The display panel 100 may be a foldable display panel that can be folded and unfolded, a curved display panel having a curved display surface, a bended display panel having an area other than the display surface curved, a rollable display panel that can be rolled or unfolded, or a stretchable display panel that can be stretched.

Alternatively, the display panel 100 may be a transparent display panel that is transparently implemented such that an object or background disposed on the lower surface of the display panel 100 is visible from the upper surface of the display panel 100. Alternatively, the display panel 100 may be a reflective display panel that can reflect an object or background on the upper surface of the display panel 100.

The display panel 100 may include a main area MA and a sub-area SBA protruding from one side of the main area MA.

The main area MA may include a display area DA in which a plurality of pixels are arranged to display an image and a non-display area NDA which is a peripheral area of the main area MA surrounding the display area DA. The display area DA may correspond to most of the main area MA. The display area DA may be disposed at the center of the main area MA. The display area DA may include a plurality of light emitting areas, scan lines driving the light emitting element, data lines, and power supply lines. The display area DA may include first, second, and third display areas DA1, DA2, and DA3.

The first display area DA1 may be disposed at one side of the display area DA. For example, the first display area DA1 may be disposed at the lower side of the display area DA. The first display area DA1 may be disposed on one side of the folding axis. The first display area DA1, as compared with the second and third display areas DA2 and DA3, may be closer to the sub-area SBA, the circuit board 210, the display driver 220, or the first touch driver 230. The first display area DA1 may correspond to a non-foldable area, but is not limited thereto.

The second display area DA2 may be disposed at the other side of the display area DA. For example, the second display area DA2 may be disposed at the upper side of the display area DA. The second display area DA2 may be disposed on the other side of the folding axis. For example, the folding axis may be between the first and second display areas DA1 and DA2. The second display area DA2, as compared with the first and third display areas DA1 and DA3, may be closer to the second touch driver 240 and the flexible film 250. The second display area DA2 may correspond to a non-foldable area, but is not limited thereto.

The third display area DA3 may be disposed between the first display area DA1 and the second display areas DA2, and the folding axis may pass through the third display area DA3. The third display area DA3 may be a foldable area, and may be folded along the folding axis. For example, the folding axis may pass through the center of the display area DA, but embodiments are not limited thereto.

The non-display area NDA may be an area outside the display area DA. The non-display area NDA may be defined as an edge area of the display panel 100. The non-display area NDA may include a scan driver supplying scan signals to scan lines, and fan-out lines connecting the data lines and the display driver 220.

Figure 2:
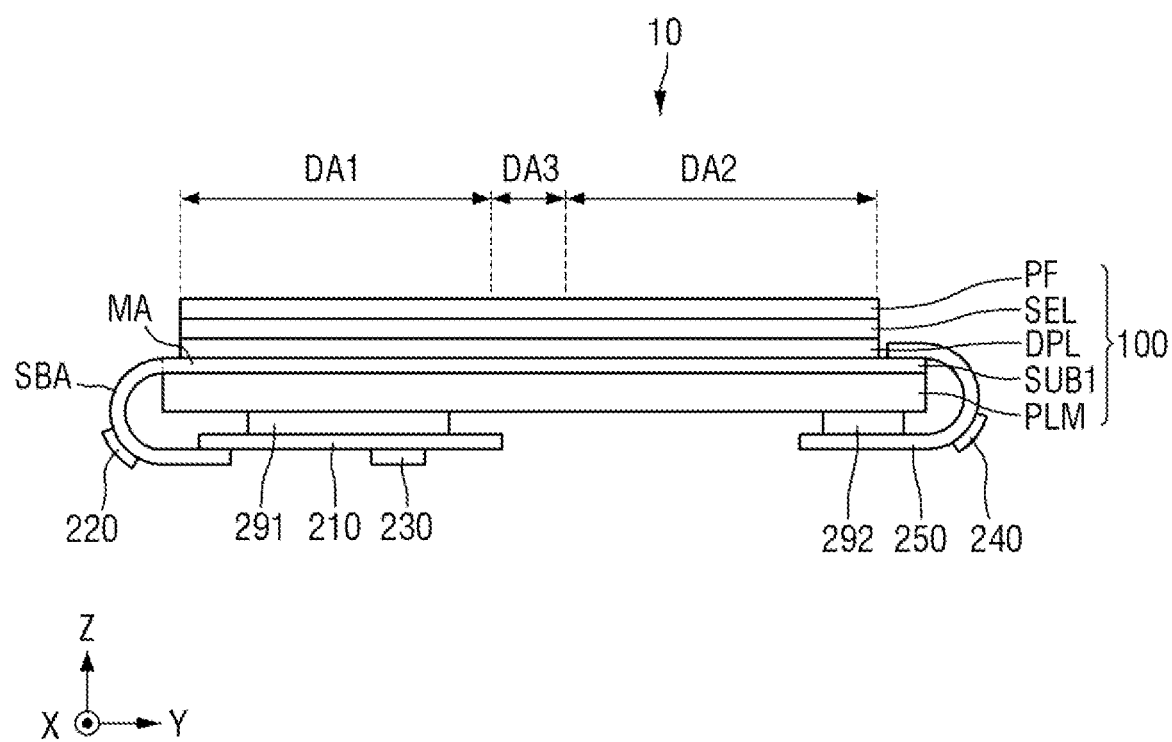
FIG. 2 is a cross-sectional view illustrating an embodiment of the display device of FIG. 1.

The sub-area SBA may protrude from one side of the main area MA in the second direction (Y-axis direction). For example, the length of the sub-area SBA in the first direction (X-axis direction) may be smaller than the length of the main area MA in the first direction (X-axis direction), and the length of the sub-area SBA in the second direction (Y-axis direction) may be smaller than the length of the main area MA in the second direction (Y-axis direction), but embodiments are not limited thereto. The sub-area SBA may be bent, and may be disposed on the lower surface of the display panel 100 as shown in FIG. 2. When the sub-area SBA is bent, the sub-area SBA may overlap the main area MA in the third direction (Z-axis direction).

The circuit board 210 may be disposed at one side of the display panel 100. The circuit board 210 may be attached to the sub-area SBA protruding from one side of the display panel 100. The circuit board 210 may be attached onto first pads of the sub-area SBA of the display panel 100 through a low-resistance and high-reliability material such as an anisotropic conductive film or a self assembly anisotropic conductive paste (SAP). The circuit board 210 may be a flexible printed circuit board (FPCB) that can be bent, a rigid printed circuit board (RPCB) that is hard to bend due to rigidity, or a composite printed circuit board that includes both the flexible printed circuit board and the rigid printed circuit board.

The display driver 220 may be disposed on the sub-area SBA of the display panel 100. The display driver 220 may receive control signals and power voltages, and may generate and output signals and voltages for driving the display panel 100. The display driver 220 may be formed as an integrated circuit (IC).

The first touch driver 230 may be disposed on the circuit board 210. The first touch driver 230 may be formed as an integrated circuit (IC). The first touch driver 230 may be connected to some sensing electrodes of a sensing electrode layer of the display panel 100 through the circuit board 210. The first touch driver 230 may be connected to sensing electrodes arranged on one side of the folding axis. For example, the first touch driver 230 may be connected to sensing electrodes overlapping a part of the third display area DA3 and the first display area DAL. The first touch driver 230 may supply a touch driving signal to each of some sensing electrodes, and may detect a change in mutual capacitance of the sensing electrodes.

The first touch driver 230 may generate touch data according to a change in an electrical signal detected at each of the sensing electrodes and transmit the touch data to a main processor. The main processor may analyze the touch data to calculate touch coordinates where a touch has occurred. The touch may include a contact touch (e.g., with direct contact with the display panel 100) and a proximity touch (e.g., without direct contact with the display panel 100). The contact touch includes that an object such as a human finger or a pen directly contacts a cover window disposed on the sensing electrode layer. The proximity touch, like hovering, includes that an object such as a human finger or a pen is located closely away from the cover window.

The display device 10 may further include a power supply unit disposed on the circuit board 210. The power supply unit may supply a power to display pixels of the display panel 100 with a power and driving voltages to the display driver 220. For example, the power supply unit may be integrated with the display driver 220, and in this case, the display driver 220 and the power supply unit may be formed as one integrated circuit.

The second touch driver 240 may be disposed on the flexible film 250. The second touch driver 240 may be formed as an integrated circuit. The second touch driver 240 may be connected to other sensing electrodes of the sensing electrode layer of the display panel 100 through the flexible film 250. The second touch driver 240 may be connected to sensing electrodes arranged on the other side of the folding axis. For example, the second touch driver 240 may be connected to other parts of the third display area DA3 and sensing electrodes overlapping the second display area DA2. The second touch driver 240 may supply a touch driving signal to each of other sensing electrodes, and detect a change in mutual capacitance of the sensing electrodes.

The flexible film 250 may be disposed at the other side of the display panel 100. The flexible film 250 may be attached onto second pads disposed on the other side of the display panel 100 through an anisotropic conductive film or a low-resistance high-reliability material such as a self assembly anisotropic conductive paste (SAP). For example, the flexible film 250 may be a flexible printed circuit board that can be bent or a flexible film such as a chip on film. The flexible film 250 may be bent and disposed on the lower surface of the display panel 100. The flexible film 250 may be disposed at the upper side of the display panel 100, but embodiments are not limited thereto. For example, the flexible film 250 may be disposed at the left or right side of the display panel 100.

FIG. 2 is a cross-sectional view illustrating an embodiment of the display device of FIG. 1.

Referring to FIG. 2, the display panel 100 may include a first base member SUB1, a display layer DPL, a sensing electrode layer SEL, a polarizing film PF, and a panel lower member PLM.

The first base member SUB1 may support the display panel 100. For example, the first base member SUB1 may include a flexible material that can be easily bent, folded, or rolled. The first base member SUB1 may be a flexible substrate capable of bending, folding, rolling, and the like. For example, the first base member SUB1 may include a flexible material and a rigid material.

The display layer DPL may be disposed on the main area MA of the first base member SUB1. The display layer DPL may display an image through light emitting areas of a plurality of pixels. The display layer DPL may include a thin film transistor layer including a plurality of thin film transistors, a light emitting element layer including light emitting elements connected to the plurality of thin film transistors, and an encapsulation layer encapsulating the light emitting element layer.

The sensing electrode layer SEL may be disposed on the display layer DPL. The sensing electrode layer SEL may include sensing electrodes. For example, the sensing electrode layer SEL may include a plurality of first sensing electrodes and a plurality of second sensing electrodes. Mutual capacitance may be formed between the plurality of first sensing electrodes and the plurality of second sensing electrodes. The first and second touch drivers 230 and 240 may sense a touch based on the mutual capacitance between the plurality of first sensing electrodes and the plurality of second sensing electrodes.

The polarizing film PF may be disposed on the sensing electrode layer SEL. For example, the polarizing film PF may include a phase retardation film such as a linear polarizing plate or a quarter-wave plate. The phase retardation film and the linear polarizing plate may be sequentially stacked on the sensing electrode layer SEL.

The display panel 100 may further include a cover window disposed on the polarizing film PF. The cover window may be attached onto the polarizing film PF by a transparent adhesive member such as an optically clear adhesive (OCA) film.

The panel lower member PLM may be included in the display panel 100. The panel lower member PLM may be attached to the lower surface of the first base member SUB1 through an adhesive member. The adhesive member may be a pressure sensitive adhesive (PSA). The panel lower member PLM may include at least one of a light blocking member for absorbing light incident from the outside, a buffer member for absorbing shock from the outside, and a heat dissipation member for efficiently dissipating heat of the display panel 100.

The light blocking member may be disposed under the first base member SUB1. The light blocking member may prevent the transmission of light and thus prevent the circuit board 210 or the first touch driver 230 disposed under the light blocking member from being visible from the top of the display panel 100. For example, the light blocking member may include a light absorbing material such as a black pigment or a black dye.

The buffer member may be disposed under the light blocking member. The buffer member may absorb an external shock to prevent the display panel 100 from being damaged. The buffer member may be formed of a single layer or multiple layers. For example, the buffer member is formed of a polymer resin such as polyurethane, polycarbonate, polypropylene, or polyethylene, or may include an elastic material such as a sponge formed by foaming a rubber, a urethane-based material, or an acrylic material.

The heat dissipation member may be disposed under the buffer member. The heat dissipation member may include a first heat dissipation layer including graphite or carbon nanotubes, and a second heat dissipation layer formed of a metal thin film such as copper, nickel, ferrite, or silver, which can block electromagnetic waves and have excellent thermal conductivity.

The sub-area SBA of the first base member SUB1 may be bent, and may be disposed under the display panel 100. The sub-area SBA of the first base member SUB1 may be attached to the lower surface of the lower panel PLM by a first adhesive member 291.

The flexible film 250 may be disposed on the other side of the display panel 100. The flexible film 250 may be attached onto second pads disposed on the upper surface of the first base member SUB1 through an anisotropic conductive film or a low-resistance high-reliability material such as a self assembly anisotropic conductive paste (SAP). The flexible film 250 may be bent, and may be disposed under the first base member SUB1. The flexible film 250 may be attached to the lower surface of the panel lower member PLM by a second adhesive member 292. For example, the first and second adhesive members 291 and 292 may be pressure sensitive adhesives.

Figure 3:
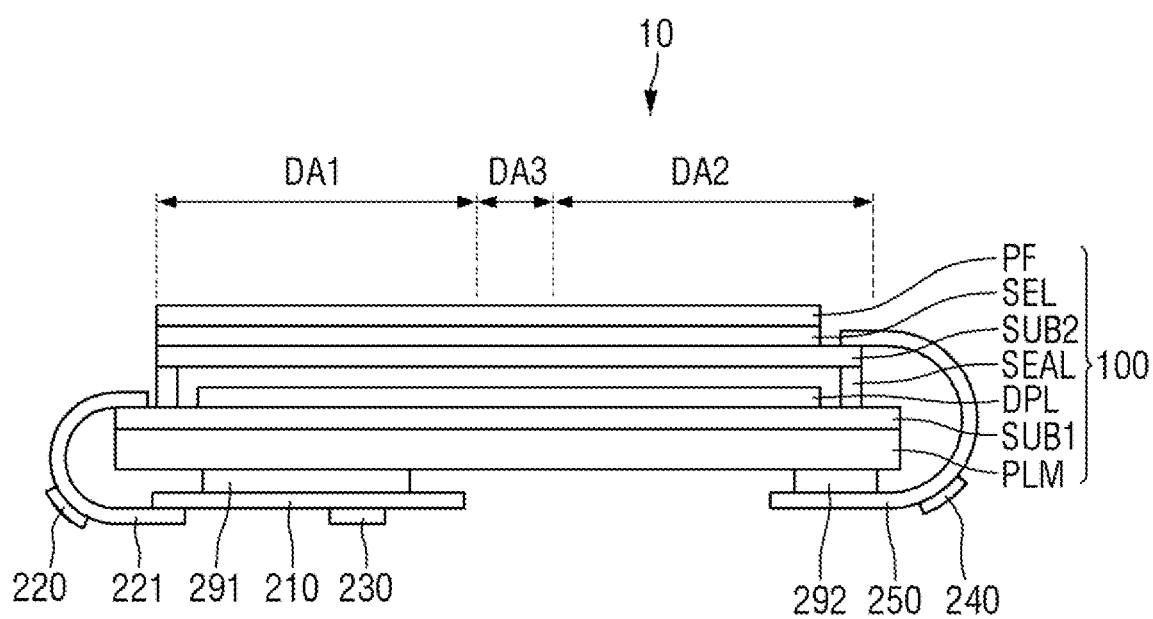
FIG. 3 is a cross-sectional view illustrating another embodiment of the display device of FIG. 1.

FIG. 3 is a cross-sectional view illustrating an embodiment of the display device of FIG. 1. Hereinafter, the same components as those described above will be briefly described or omitted for descriptive convenience.

Referring to FIG. 3, the display panel 100 may include a first base member SUB1, a display layer DPL, an adhesive member SEAL, a second base member SUB2, a sensing electrode layer SEL, a polarizing film PF, and a panel lower member PLM.

The adhesive member SEAL may bond the first base member SUB1 and the second base member SUB2. The adhesive member SEAL may be disposed on edges of the first base member SUB1 and the second base member SUB2 to surround the display layer DPL. The adhesive member SEAL may be a frit adhesive layer, an ultraviolet curing resin layer, or a thermosetting resin layer, but is not limited thereto.

The second base member SUB2 may support the sensing electrode layer SEL. For example, the second base member SUB2 may include a flexible material that can be easily bent, folded, or rolled. The second base member SUB2 may be a flexible substrate capable of bending, folding, rolling, and the like. For example, the second base member SUB2 may include a flexible material and a rigid material.

The sensing electrode layer SEL may be disposed on the second base member SUB2. The sensing electrode layer SEL may include sensing electrodes. For example, the sensing electrode layer SEL may include a plurality of first sensing electrodes and a plurality of second sensing electrodes. Mutual capacitance may be formed between the plurality of first sensing electrodes and the plurality of second sensing electrodes. The first and second touch drivers 230 and 240 may sense a touch based on the mutual capacitance between the plurality of first sensing electrodes and the plurality of second sensing electrodes.

The polarizing film PF may be disposed on the sensing electrode layer SEL. For example, the polarizing film PF may include a phase retardation film such as a linear polarizing plate or a quarter-wave plate. The phase retardation film and the linear polarizing plate may be sequentially stacked on the sensing electrode layer SEL.

For example, the sensing electrode layer SEL and the polarizing film PF may be integrally formed. In this case, the sensing electrode layer SEL, the phase retardation film, and the linear polarizing plate may be sequentially stacked on the second base member SUB2.

The flexible film 250 may be disposed on the other side of the display panel 100. The flexible film 250 may be attached onto second pads disposed on the upper surface of the second base member SUB2 through an anisotropic conductive film or a low-resistance high-reliability material such as a self assembly anisotropic conductive paste (SAP). The flexible film 250 may be bent, and may be disposed under the first base member SUB1. The flexible film 250 may be attached to the lower surface of the panel lower member PLM by the second adhesive member 292. For example, the first and second adhesive members 291 and 292 may be pressure sensitive adhesives.

Figure 4:
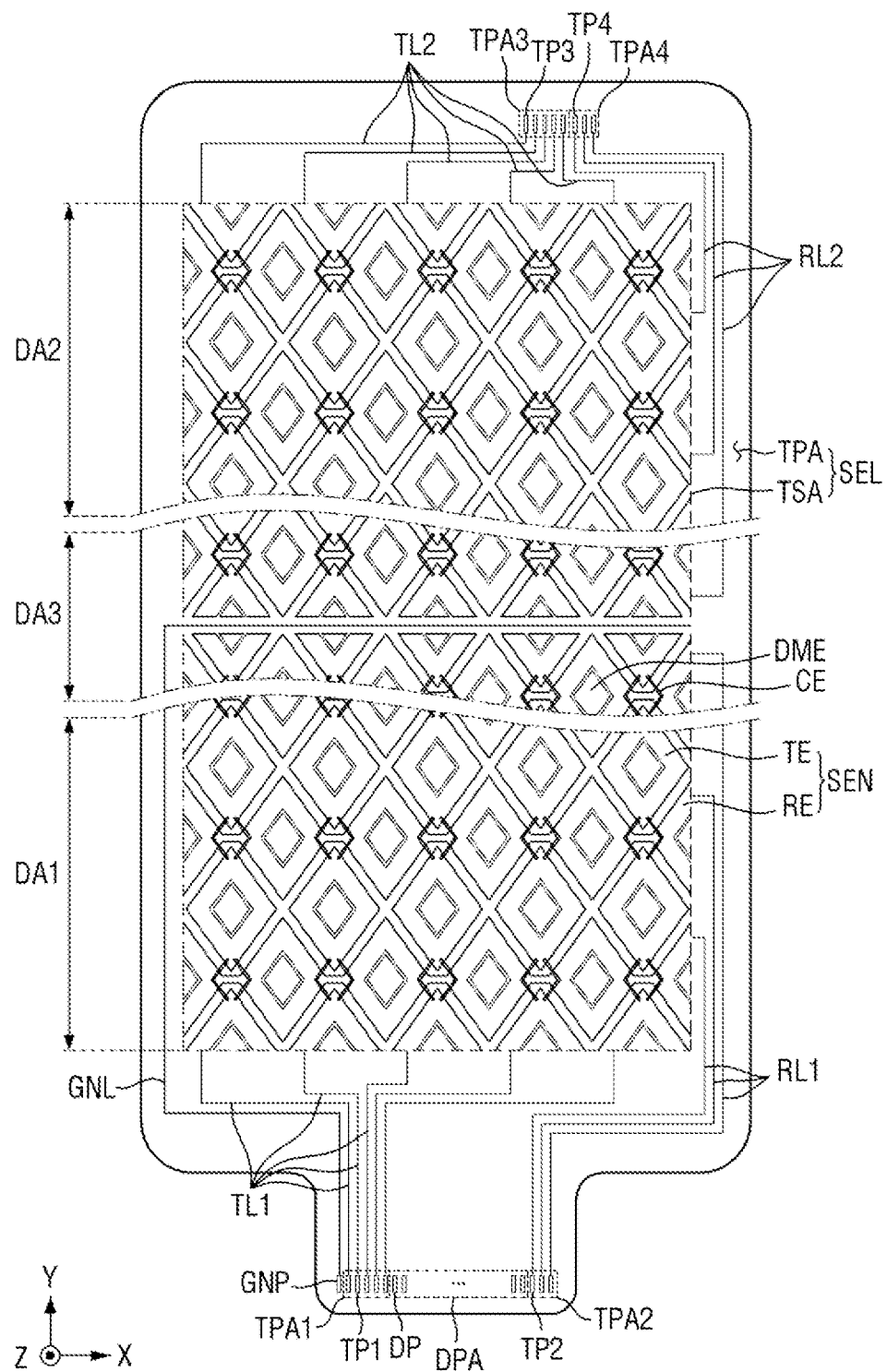
FIG. 4 is a plan view of an embodiment of a sensing electrode layer of the display device of FIG. 1.
Figure 5:
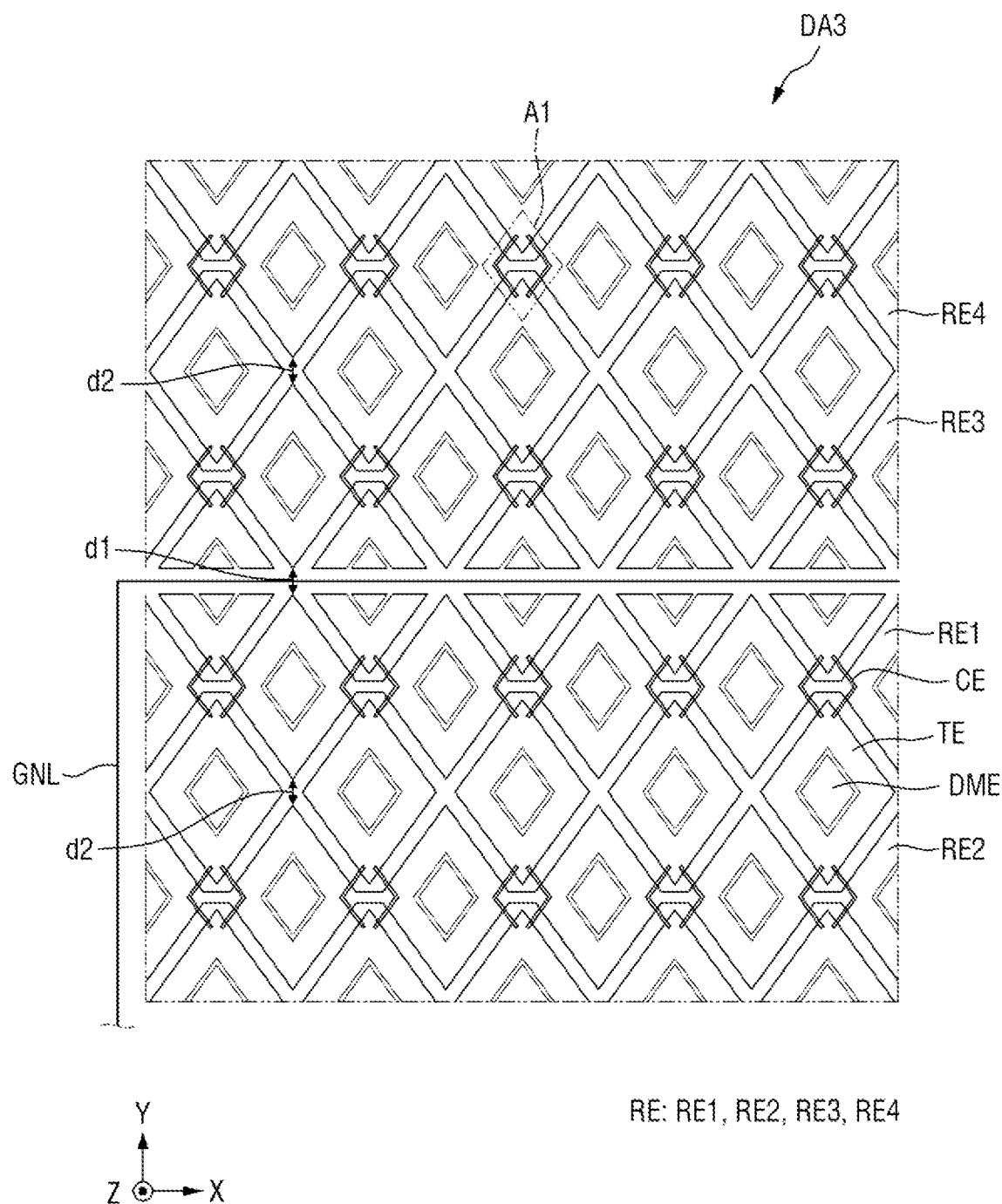
FIG. 5 is a plan view of a third display area of the display device of FIG. 1 illustrating the sensing electrode layer of FIG. 4.

FIG. 4 is a plan view of an embodiment of a sensing electrode layer of the display device of FIG. 1, and FIG. 5 is a plan view of third display area if the display device of FIG. 1 illustrating the sensing electrode layer of FIG. 4.

Referring to FIGS. 4 and 5, the sensing electrode layer SEL may include a touch sensor area TSA for sensing a user's touch, and a touch peripheral area TPA disposed around the touch sensor area TSA. The touch sensor area TSA may overlap the display area DA of the display layer DPL, and the touch peripheral area TPA may overlap the non-display area NDA of the display layer DPL.

The touch sensor area TSA may include a plurality of sensing electrodes SEN and a plurality of dummy patterns DME. The plurality of sensing electrodes SEN may form mutual capacitance to sense the touch of an object or a person. The plurality of sensing electrodes SEN may include a plurality of driving electrodes TE and a plurality of sensing electrodes RE. For example, the driving electrode TE may be defined as a first sensing electrode, and the sensing electrode RE may be defined as a second sensing electrode. For example, the driving electrode TE may be defined as a second sensing electrode, and the sensing electrode RE may be defined as a first sensing electrode.

The plurality of driving electrodes TE may be arranged in the first direction (X-axis direction) and the second direction (Y-axis direction). The plurality of driving electrodes TE may be spaced apart from each other in the first direction (X-axis direction) and the second direction (Y-axis direction). The driving electrodes TE adjacent to each other in the second direction (Y-axis direction) may be electrically connected through a connection electrode CE.

Among the plurality of driving electrodes TE, some driving electrodes TE disposed on one side of the folding axis may be connected to a first touch pad unit TP1 through a first driving line TL1. For example, some of the driving electrodes TE may be electrically connected along the second direction (Y-axis direction) from one side of the folding axis disposed in the third display area DA3 to one end of the first display area DA1, and the driving electrodes TE disposed at one end of the first display area DA1 may be connected to the first driving line TL1. Here, one end of the first display area DA1 may correspond to one end of the display panel 100. The first driving line TL1 may connect the driving electrodes TE disposed at one end of the first display area DA1 and the first touch pad unit TP1 disposed at one side of the display panel 100. The first touch pad unit TP1 may be connected to the first touch driver 230 through the circuit board 210.

Among the plurality of driving electrodes TE, other driving electrodes TE disposed on the other side of the folding axis may be connected to a third touch pad unit TP3 through a second driving line TL2. For example, others of the driving electrodes TE may be electrically connected along the second direction (Y-axis direction) from the other side of the folding axis disposed in the third display area DA3 to the other end of the second display area DA2, and the driving electrodes TE disposed at the other end of the second display area DA2 may be connected to the second driving line TL2. Here, the other end of the second display area DA2 may correspond to the other end of the display panel 100. The second driving line TL2 may connect the driving electrodes TE disposed at another end of the second display area DA2 and the third touch pad unit TP3 disposed at the other side of the display panel 100. The third touch pad unit TP3 may be connected to the second touch driver 240 through the flexible film 250.

The connection electrode CE may be bent at least once. For example, the connection electrode CE may have an angled shape ("<" or ">") in a plan view, but the shape of the connection electrode CE is not limited thereto. The driving electrodes TE adjacent to each other in the second direction (Y-axis direction) may be connected by the plurality of connection electrodes CE, and may be stably connected through the residual connection electrodes CE even when any one of the connection electrodes CE is disconnected. The driving electrodes TE adjacent to each other may be connected by two connection electrodes CE, but the number of connection electrodes CE is not limited thereto.

The connection electrode CE may be disposed in a different layer from the plurality of driving electrodes TE and the plurality of sensing electrodes RE. The sensing electrodes RE adjacent to each other in the first direction (X-axis direction) may be electrically connected through a connection portion disposed on the same layer as the plurality of driving electrodes TE or the plurality of sensing electrodes RE, and the driving electrodes TE adjacent to each other in the second direction (Y-axis direction) may be electrically connected through the connection electrode CE disposed in a different layer from the plurality of driving electrodes TE or the plurality of sensing electrodes RE. Therefore, even when the connecting portion of the plurality of sensing electrodes RE and the connecting electrode CE overlap each other in the third direction (Z-axis direction), the plurality of driving electrodes TE may be insulated from the plurality of sensing electrodes RE. Accordingly, mutual capacitance may be formed between the driving electrode TE and the sensing electrode RE.

The plurality of sensing electrodes RE may extend in the first direction (X-axis direction), and may be spaced apart from each other in the second direction (Y-axis direction). The plurality of sensing electrodes RE may be arranged in the first direction (X-axis direction) and the second direction (Y-axis direction), and the sensing electrodes RE adjacent in the first direction (X-axis direction) may be electrically connected through a connection portion.

Among the plurality of sensing electrodes, some sensing electrodes RE disposed on one side of the folding axis may be connected to the second touch pad unit TP2 through a first sensing line RL1. For example, some of the sensing electrodes RE may be electrically connected along the first direction (X-axis direction) from the left side of the display area DA to the right side of the display area DA, and the sensing electrodes RE disposed at the other end adjacent to one end of the display area DA may be connected to the first sensing line RL1. Here, the other end adjacent to one end of the display area DA may be the right end of the display area DA disposed on one side of the folding axis. The first sensing line RL1 may connect the sensing electrodes RE disposed at the right end of the display area DA on one side of the folding axis and the second touch pad unit TP2 disposed at one side of the display panel 100. The first sensing line RL1 may extend to the second touch pad unit TP2 disposed in the sub-area SBA via the right and lower sides of the touch peripheral area TPA. The second touch pad unit TP2 may be adjacent to the first touch pad unit TP1 or the display pad unit DP, and may be connected to the first touch driver 230 through the circuit board 210.

Among the plurality of sensing electrodes, other sensing electrodes RE disposed on the other side of the folding axis may be connected to the fourth touch pad unit TP4 through a second sensing line RL2. For example, others of the sensing electrodes RE may be electrically connected along the first direction (X-axis direction) from the left side of the display area DA to the right side of the display area DA, and the sensing electrodes RE disposed at the other end adjacent to another end of the display area DA may be connected to the second sensing line RL2. Here, the other end adjacent to another end of the display area DA may be the right end of the display area DA disposed on the other side of the folding axis. The second sensing line RL2 may connect the sensing electrodes RE disposed at the right end of the display area DA on the other side of the folding axis and the fourth touch pad unit TP4 disposed at the other side of the display panel 100. The second sensing line RL2 may extend to the fourth touch pad unit TP4 disposed at the upper side of the touch peripheral area TPA via the right side of the touch peripheral area TPA. The fourth touch pad unit TP4 may be adjacent to the third touch pad unit TP3 or the display pad unit DP, and may be connected to the second touch driver 240 through the flexible film 250.

Each of the plurality of dummy patterns DME may be surrounded by the driving electrode TE or the sensing electrode RE. Each of the plurality of dummy patterns DME may be spaced apart from and insulated from the driving electrode TE or the sensing electrode RE. Accordingly, the dummy pattern DME may be electrically floated.

For example, each of the length of one driving electrode TE surrounded by adjacent sensing electrodes RE in the first direction (X-axis direction) and the length of the one driving electrode TE in the second direction (Y-axis direction) may be about 3 mm to about 5 mm. The length of the driving electrode TE in the first direction (X-axis direction) refers to a distance from the left end to the right end of the driving electrode TE, and the length of the driving electrode TE in the second direction (Y-axis direction) refers to a distance from the upper end to the lower end of the driving electrode TE. Each of the length of one sensing electrode RE surrounded by adjacent driving electrodes TE in the first direction (X-axis direction) and the length of the one sensing electrode RE in the second direction (Y-axis direction) may also be about 3 mm to about 5 mm.

For example, each of the driving electrode TE, the sensing electrode RE, and the dummy pattern DME may have a rhombic shape in a plan view, but the shape thereof is not limited thereto. For example, each of the driving electrode TE, the sensing electrode RE, and the dummy pattern DME may have a rectangular shape other than the rhombic shape, a polygonal shape other than the rectangular shape, a circular shape, or an oval shape.

The first driving line TL1 may supply touch driving signals supplied from the first touch driver 230 to the plurality of driving electrodes TE disposed on one side of the folding axis. The second driving line TL2 may supply touch driving signals supplied from the second touch driver 240 to the plurality of driving electrodes TE disposed on the other side of the folding axis. Accordingly, among the plurality of driving electrodes TE, some driving electrodes TE may receive touch driving signals from the first touch driver 230, and other driving electrodes TE may receive touch driving signals from the second touch driver 240, thereby reducing the resistance-capacitance (RC) relay of the touch driving signal. Consequently, in the display device 10, the occurrence of a difference between the touch driving signal applied to the driving electrodes TE disposed at one side of the touch sensor area TSA and the touch driving signal applied to the driving electrodes TE disposed at the other side of the touch sensor area TSA may be prevented, thereby improving touch sensitivity.

Further, in the display device 10, the display layer DPL and the sensing electrode layer SEL may be provided in the third display area DA3 that is folded along the folding axis, so that the display layer DPL of the third display area DA3 may display an image, and the sensing electrode layer SEL of the third display area DA3 may detect a touch.

The display pad area DPA, the first touch pad area TPA1, and the second touch pad area TPA2 may be disposed at one side of the display panel 100. The display pad area DPA, the first touch pad area TPA1, and the second touch pad area TPA2 may be disposed in the sub-area SBA. The display pad area DPA, the first touch pad area TPA1, and the second touch pad area TPA2 may be electrically connected to the circuit board 210 through an anisotropic conductive film or a low-resistance high-reliability material such as a self assembly anisotropic conductive paste (SAP).

The display pad area DPA may include a plurality of display pad units DP. The plurality of display pad units DP may be connected to the main processor through the circuit board 210. The plurality of display pad units DP may be connected to the circuit board 210 to receive digital video data and supply the digital video data to the display driver 220.

The first touch pad area TPA1 may be disposed at one side of the display pad area DPA, and may include a plurality of first touch pad units TP1. The plurality of first touch pad units TP1 may be electrically connected to the first touch driver 230 disposed on the circuit board 210. The plurality of first touch pad units TP1 may supply touch driving signals to the driving electrodes TE disposed on one side of the folding axis through the plurality of first driving lines TL1.

The second touch pad area TPA2 may be disposed at the other side of the display pad area DPA, and may include a plurality of second touch pad units TP2. The plurality of second touch pad units TP2 may be electrically connected to the first touch driver 230 disposed on the circuit board 210. The first touch driver 230 may detect a change in mutual capacitance between the driving electrode TE and the sensing electrode RE through the plurality of first sensing lines RL1 connected to the plurality of second touch pad units TP2.

The third touch pad area TPA3 and the fourth touch pad area TPA4 may be disposed at the other side of the display panel 100.

The third touch pad area TPA3 may include a plurality of third touch pad units TPA3. The plurality of third touch pad units TP3 may be electrically connected to the second touch driver 240 disposed on the flexible film 250. The plurality of third touch pad units TP3 may supply touch driving signals to the driving electrodes TE disposed on the other side of the folding axis through the plurality of second driving lines TL2.

The fourth touch pad area TPA4 may include a plurality of fourth touch pad units TP4. The plurality of fourth touch pad units TP4 may be electrically connected to the second touch driver 240 disposed on the flexible film 250. The second touch driver 240 may detect a change in mutual capacitance between the driving electrode TE and the sensing electrode RE through the plurality of second sensing lines RL2 connected to the plurality of fourth touch pad units TP4.

The sensing electrode layer SEL may further include a metal line GNL. The metal line GNL may be disposed between the plurality of driving electrodes TE connected to the plurality of first driving lines TL1 and the plurality of driving electrodes TE connected to the plurality of second driving lines TL2. The metal line GNL may be disposed between some driving electrodes TE disposed on one side of the folding axis and other driving electrodes TE disposed on the other side of the folding axis. The metal line GNL may be substantially parallel to the folding axis, but embodiments are not limited thereto. For example, the metal line GNL may intersect with the folding axis in a plan view, or the metal line GNL may overlap the folding axis in the third direction (Z-axis direction), but embodiments are not limited thereto. The metal line GNL may extend from the right side to the left side of the third display area DA, and may be connected to the ground pad unit GNP disposed at one side of the display panel 100 via the left and lower sides of the touch peripheral area TPA. The ground pad unit GNP may be adjacent to the first touch pad unit TP1.

The metal line GNL may be grounded to a specific voltage through the ground pad unit GNP. When the metal line GNL is grounded, electrical interference between the driving electrode TE disposed at one side of the metal line GNL and the sensing electrode RE disposed at the other side of the metal line GNL may be prevented. Further, the metal line GNL may prevent electrical interference between the driving electrode TE disposed at the other side of the metal line GNL and the sensing electrode RE disposed at one side of the metal line GNL. Therefore, the touch sensitivity of the sensing electrode layer SEL may be improved due to the plurality of sensing electrodes SEN spaced apart from each other with the metal line GNL therebetween, and each of the first and second touch drivers 230 and 240 may easily detect mutual capacitance formed on the plurality of sensing electrodes SEN.

The plurality of sensing electrodes RE may include first to fourth sensing electrodes RE1 to RE4. The first sensing electrode RE1 may disposed on one side of the folding axis and be closest to the folding axis or the metal line GNL, and the second sensing electrode RE2 may be disposed at one side of the first sensing electrode RE1. The third sensing electrode RE3 may disposed on the other side of the folding axis and be closest to the folding axis or the metal line GNL, and the fourth sensing electrode RE4 may be disposed at the other side of the third sensing electrode RE3. The metal line GNL may be disposed between the first and second sensing electrodes RE1 and RE2 and may extend in a direction parallel to each of the first to fourth sensing electrodes RE1 to RE4.

For example, the first distance d1 between the first sensing electrode RE1 and the third sensing electrode RE3 may be substantially equal to the second distance d2 between the first sensing electrode RE1 and the second sensing electrode RE2. The first distance d1 between the first sensing electrode RE1 and the third sensing electrode RE3 may be substantially equal to the second distance d2 between the third sensing electrode RE3 and the fourth sensing electrode RE4. Therefore, even when the metal line GNL is disposed between the first and second sensing electrodes RE1 and RE2, the first to fourth sensing electrodes RE1 to RE4 may be arranged at substantially the same intervals.

The size of the driving electrode TE disposed between the first sensing electrode RE1 and the metal line GNL may be half of or less than the size of the driving electrode TE disposed between the first and second sensing electrodes RE1 and RE2. The size of the driving electrode TE disposed between the third sensing electrode RE3 and the metal line GNL may be half of or less than the size of the driving electrode TE disposed between the third and fourth sensing electrodes RE3 and RE4. For example, the sum of the size of the driving electrode TE disposed between the first sensing electrode RE1 and the metal line GNL and the size of the driving electrode TE disposed between the third sensing electrode RE3 and the metal line GNL may be smaller than the size of the driving electrode TE disposed between the first and second sensing electrodes RE1 and RE2 by the sum (e.g., the first distance d1) of a thickness of the metal line GNL and intervals between the metal line GNL and the driving electrodes TE. Accordingly, the plurality of driving electrodes TE may be arranged at substantially the same intervals, except for the driving electrodes TE directly facing the metal line GNL.

The facing area of the plurality of driving electrodes TE spaced apart from each other and adjacent to folding axis or the metal line GNL interposed therebetween face each other may be larger than the facing area of the plurality of sensing electrodes RE spaced from each other and adjacent to the folding axis or the metal line GNL interposed therebetween face each other. Accordingly, the plurality of driving electrodes TE facing each other and adjacent to the metal line GNL interposed therebetween may have a shape that is formed through cutting the driving electrode TE of the first display area DA1 or the second display area DA2 by the metal line GNL.

Figure 6:
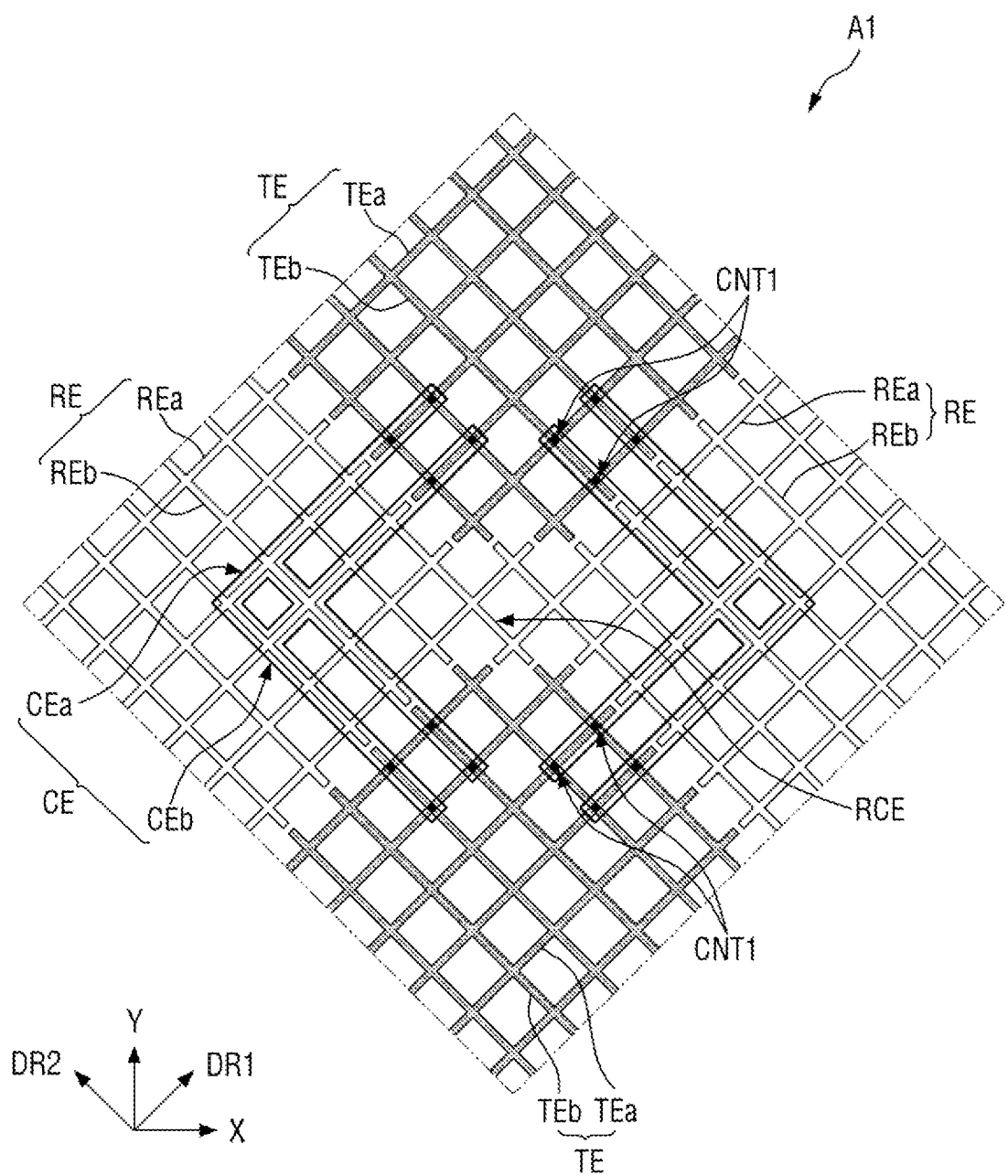
FIG. 6 is an enlarged view of area A1 of FIG. 5.
Figure 7:
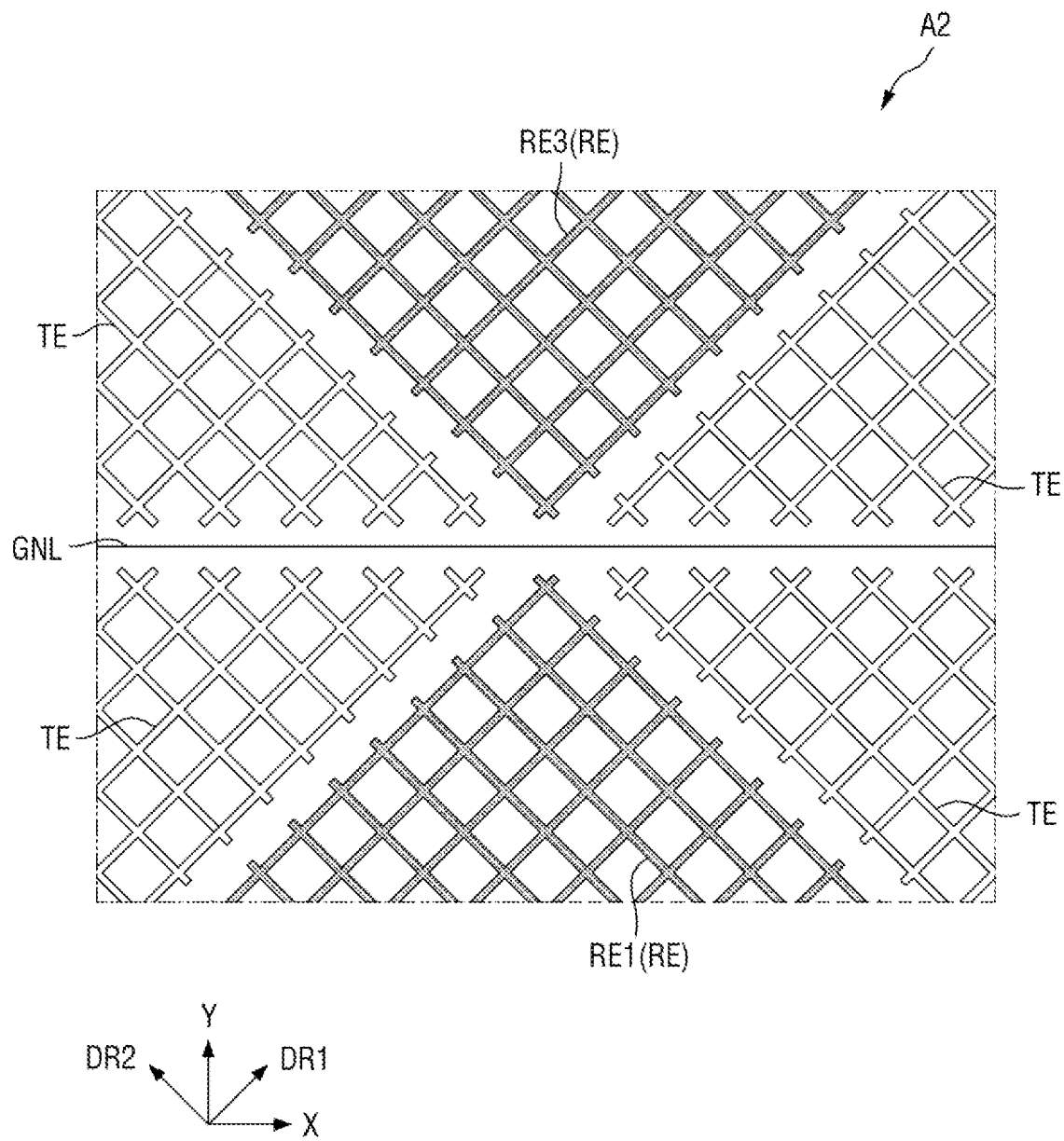
FIG. 7 is an enlarged view of area A2 of FIG. 5.
Figure 8:
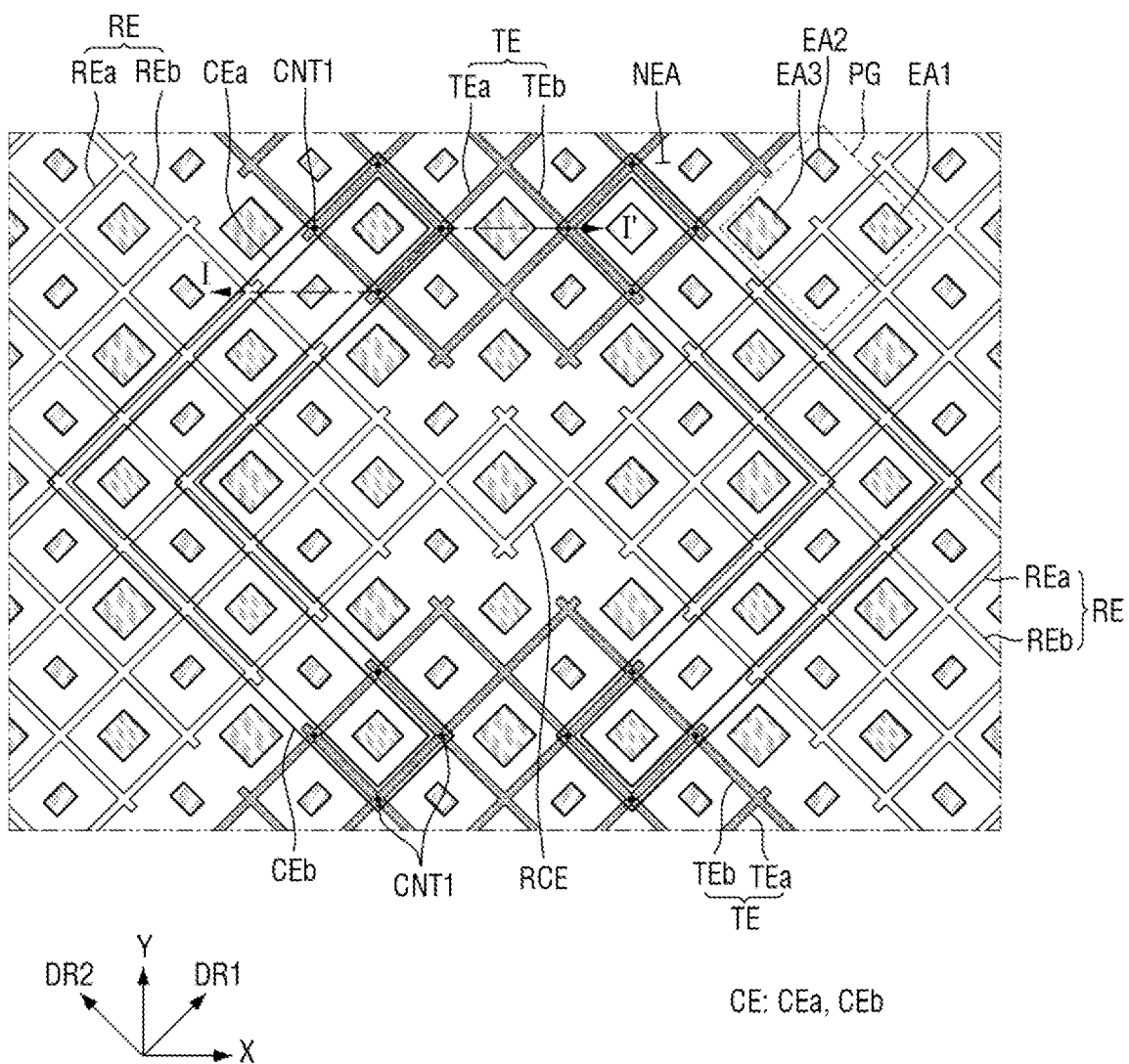
FIG. 8 is a plan view of an embodiment of a display layer and a sensing electrode layer of the display device of FIG. 1.

FIG. 6 is an enlarged view of area A1 in FIG. 5, FIG. 7 is an enlarged view of area A2 in FIG. 5, and FIG. 8 is a plan view of an embodiment of a display layer and a sensing electrode layer of the display device of FIG. 1.

Referring to FIGS. 6 to 8, the plurality of driving electrodes TE, the plurality of sensing electrodes RE, the plurality of dummy patterns DME, and the metal line GNL may be disposed on the same layer and spaced apart from each other. Accordingly, a plurality of gaps GAP may be formed between the driving electrode TE and the sensing electrode RE, may be formed between the driving electrode TE and the dummy pattern DME, and may be formed between the sensing electrode RE and the dummy pattern DME.

The plurality of driving electrodes TE may be arranged in the first direction (X-axis direction) and the second direction (Y-axis direction). The plurality of driving electrodes TE may be spaced apart from each other in the first direction (X-axis direction) and the second direction (Y-axis direction). The driving electrodes TE adjacent in the second direction (Y-axis direction) may be electrically connected through the connection electrode CE.

The connection electrode CE may be bent at least once. For example, the connection electrode CE may have an angled shape ("<" or ">") in a plan view, but the shape of the connection electrode CE is not limited thereto. The driving electrodes TE adjacent to each other in the second direction (Y-axis direction) may be connected by the plurality of connection electrodes CE, and may be stably connected through the residual connection electrodes CE even when any one of the connection electrodes CE is disconnected. The driving electrodes TE adjacent to each other may be connected by two connection electrodes CE, but the number of connection electrodes CE is not limited thereto.

The plurality of sensing electrodes RE may extend in the first direction (X-axis direction) and may be spaced apart from each other in the second direction (Y-axis direction). The plurality of sensing electrodes RE may be arranged in the first direction (X-axis direction) and the second direction (Y-axis direction), and the sensing electrodes RE adjacent in the first direction (X-axis direction) may be electrically connected through the connection portion REC. For example, the connection portion REC of the sensing electrodes RE may be disposed between the driving electrodes TE adjacent to each other. For example, the connection portion REC of the sensing electrodes RE may be disposed in an area where the driving electrodes TE adjacent to each other have the shortest distance from each other.

The plurality of connection electrodes CE may be disposed in a different layer from the driving electrode TE and the sensing electrode RE. The connection electrode CE may include a first portion CEa and a second portion CEb. For example, the second portion CEb of the connection electrode CE may be connected to the driving electrode TE disposed at one side thereof through the first contact hole CNT1 and may extend in a second diagonal direction DR2. The first portion CEa of the connection electrode CE may be bent from the second portion CEb in an area overlapping the sensing electrode RE and may extend in a first diagonal direction DR1, and may be connected to the driving electrode TE disposed at the other side thereof through the first contact hole CNT1. Hereinafter, the first diagonal direction DR1 may be a direction between the first direction (X-axis direction) and the second direction (Y-axis direction), and the second diagonal direction DR2 may be a direction intersecting the first diagonal direction DR1. Accordingly, each of the plurality of connection electrodes CE may connect adjacent driving electrodes TE in the second direction (Y-axis direction).

For example, the plurality of driving electrodes TE, the plurality of sensing electrodes RE, and the plurality of dummy patterns DME may be formed in a mesh structure or a network structure in a plan view. Therefore, the plurality of driving electrodes TE, the plurality of sensing electrodes RE, and the plurality of dummy patterns DME may not overlap first to third light emitting areas EA1 to EA3 of a pixel group PG. The plurality of connection electrodes CE may also not overlap the first to third light emitting areas EA1 to EA3. Accordingly, the display device 10 may prevent the luminance of light emitted from the first to third light emitting areas EA1 to EA3 from being reduced by the sensing electrode layer SEL.

Each of the driving electrodes TE may include a first portion TEa extending in the first diagonal direction DR1 and a second portion TEb extending in the second diagonal direction DR2. Each of the sensing electrodes RE may include a first portion REa extending in the first diagonal direction DR1 and a second portion REb extending in the second diagonal direction DR2.

For example, the plurality of driving electrodes TE, the plurality of sensing electrodes RE, and the plurality of dummy patterns DME may be formed in an entire surface structure, not in a mesh structure or a network structure, in a plan view. In this case, the plurality of driving electrodes TE, the plurality of sensing electrodes RE, and the plurality of dummy patterns DME may include a transparent conductive material having high light transmittance, such as ITO and IZO, and may prevent the luminance of light emitted from the first to third light emitting areas EA1 to EA3 from being reduced.

The plurality of pixels may include first to third sub-pixels, and each of the first to third sub-pixels may include first to third light emitting areas EA1 to EA3. For example, the first light emitting area EA1 may emit light of a first color (e.g., a red light), the second light emitting area EA2 may emit light of a second color (e.g., a green light), and the third light emitting area EA3 may emit light of a third color (e.g., a blue light).

Each of the first light emitting area EA1, the second light emitting area EA2, and the third light emitting area EA3 may have a rhombic shape or a rectangular shape in a plan view, but the shape thereof is not limited thereto. Each of the first to third light emitting areas EA1 to EA3 may have a polygonal shape, a circular shape, or an elliptical shape other than the rectangular shape in a plan view. For example, the area of the third light emitting area EA3 may be the largest, and the area of the second light emitting area EA2 may be the smallest, but embodiments are not limited thereto.

One pixel group PG may include one first light emitting area EA1, two second light emitting areas EA2, and one third light emitting area EA3 to express or realize white gradation. Accordingly, white gradation may be expressed by the combination of the light emitted from one first light emitting area EA1, the light emitted from two second light emitting areas EA2, and the light emitted from one third light emitting area EA3.

The second light emitting areas EA2 may be arranged in odd rows. The second light emitting areas EA2 may be arranged in substantially parallel in the first direction (X-axis direction) in each of the odd rows. One of the second light emitting areas EA2 adjacent to each other may have a long side in the first diagonal direction DR1 and a short side in the second diagonal direction DR2, and the other of the second light emitting areas EA2 adjacent to each other may have a long side in the second diagonal direction DR2 and a short side in the first diagonal direction DR1.

The first light emitting areas EA1 and the third light emitting areas EA3 may be arranged in even rows. The first light emitting areas EA1 and the third light emitting areas EA3 may be alternately arranged in each of the even rows.

Figure 9:
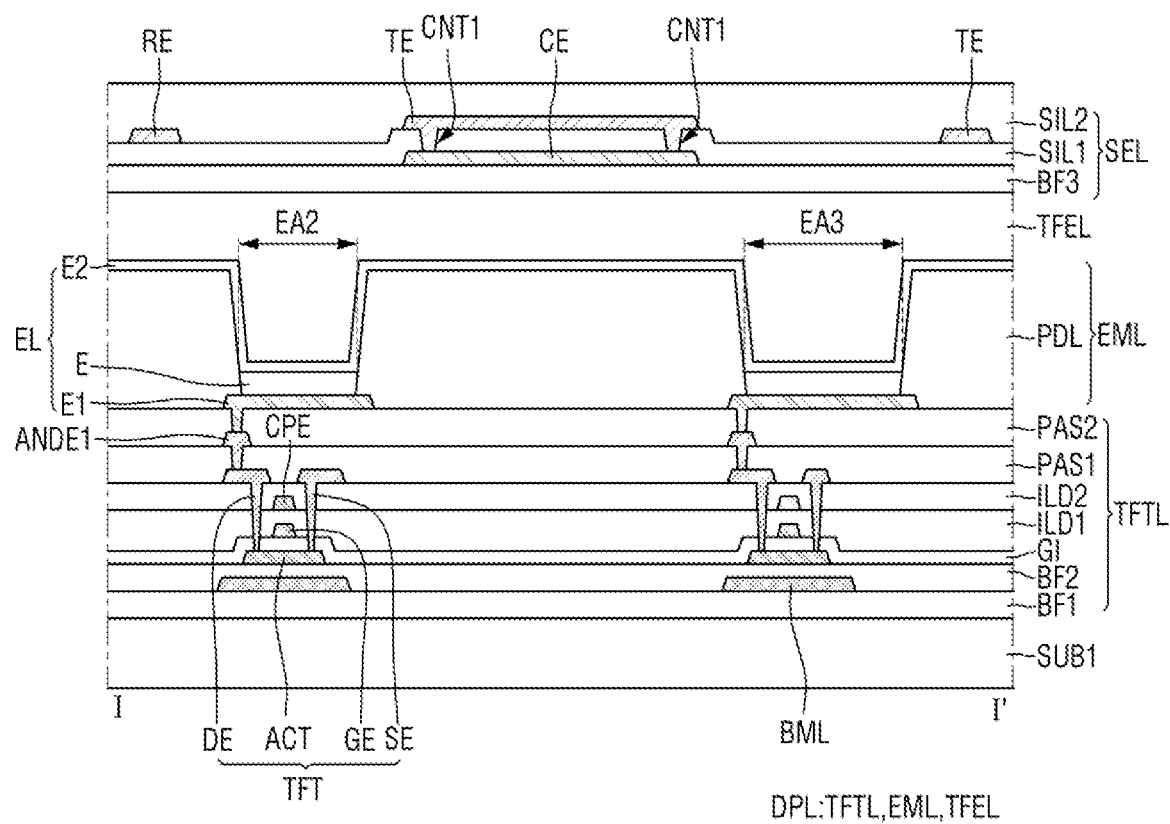
FIG. 9 is a cross-sectional view taken along the line I-I' of FIG. 8.

FIG. 9 is a cross-sectional view taken along the line I-I' of FIG. 8.

Referring to FIG. 9, the display device 10 may include a first base member SUB1, a thin film transistor layer TFTL, a light emitting element layer EML, an encapsulation layer TFEL, and a sensing electrode layer SEL.

The first base member SUB1 may support the display panel 100. For example, the first base member SUB1 may include a material that can be easily bent, folded, or rolled due to its flexibility. The first base member SUB1 may be a flexible substrate capable of bending, folding, rolling, and the like. For example, the first base member SUB1 may include a flexible material and a rigid material.

The thin film transistor layer TFTL may include first and second buffer layers BF1 and BF2, a thin film transistor TFT, a gate insulating film GI, a first interlayer insulating film ILD1, a capacitor electrode CPE, a second interlayer insulating film ILD2, a first passivation layer PAS1, an anode connection electrode ANDE1, and a second passivation layer PAS2.

The first buffer layer BF1 may be disposed on the first base member SUB1. The first buffer layer BF1 may be formed of an inorganic film capable of preventing the infiltration of air or moisture. For example, the first buffer layer BF1 may include a plurality of inorganic films alternately stacked. The first buffer layer BF1 may be formed as a multi-layer film in which at least one inorganic layer of a silicon nitride layer, a silicon oxy nitride layer, a silicon oxide layer, a titanium oxide layer, and an aluminum oxide layer is alternately stacked, but embodiments are not limited thereto.

A light blocking layer BML may be disposed on the first buffer layer BF1. For example, the light blocking layer BML may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof. For example, the light blocking layer BML may be an organic layer including black pigment.

The second buffer layer BF2 may cover the first buffer layer BF1 and the light blocking layer BML. The second buffer layer BF2 may be formed of an inorganic film capable of preventing the infiltration of air or moisture. For example, the second buffer layer BF2 may include a plurality of inorganic films alternately stacked. The second buffer layer BF2 may be formed of the materials used in forming the first buffer layer BF1.

The thin film transistor TFT may be disposed on the second buffer layer BF2 and may constitute a pixel circuit of each of the plurality of pixels. For example, the thin film transistor TFT may be a driving transistor or a switching transistor of a pixel circuit. The thin film transistor TFT may include a semiconductor layer ACT, a gate electrode GE, a source electrode SE, and a drain electrode DE.

The semiconductor layer ACT may be provided on the second buffer layer BF2. The semiconductor layer ACT may overlap the gate electrode GE, the source electrode SE, and the drain electrode DE. The semiconductor layer ACT may directly contact the source electrode SE and the drain electrode DE, and may face the gate electrode GE with the gate insulating film GI interposed therebetween.

The gate electrode GE may be disposed on the gate insulating film GI. The gate electrode GE may overlap the semiconductor layer ACT with the gate insulating film GI interposed therebetween.

The source electrode SE and the drain electrode DE may be disposed to be spaced apart from each other on the second interlayer insulating film ILD2. The source electrode SE may contact one end of the semiconductor layer ACT through a contact hole provided in the gate insulating film GI and the first and second interlayer insulating films ILD1 and ILD2. The drain electrode DE may contact the other end of the semiconductor layer ACT through a contact hole provided in the gate insulating film GI and the first and second interlayer insulating films ILD1 and ILD2. The drain electrode DE may be connected to an anode connection electrode ANDE1 through a contact hole provided in the first passivation layer PAS1.

The gate insulating film GI may be provided on the semiconductor layer ACT. For example, the gate insulating film GI may be disposed on the semiconductor layer ACT and the second buffer layer BF2, and may insulate the semiconductor layer ACT from the gate electrode GE. The gate insulating film GI may include a contact hole through which the source electrode SE penetrates and a contact hole through which the drain electrode DE penetrates.

The first interlayer insulating film ILD1 may be disposed on the gate electrode GE. For example, the first interlayer insulating film ILD1 may include a contact hole through which the source electrode SE penetrates and a contact hole through which the drain electrode DE penetrates. Here, the contact hole of the first interlayer insulating film ILD1 may be connected to the contact hole of the gate insulating film GI and the contact hole of the second interlayer insulating film ILD2.

The capacitor electrode CPE may be disposed on the first interlayer insulating film ILD1. The capacitor electrode CPE may overlap the gate electrode GE in the third direction (Z-axis direction). For example, the capacitor electrode CPE may be formed as a single layer or multiple layers including at least one selected from molybdenum (Mo), aluminum (Al), chromium (Cr), gold (Au), titanium (Ti), nickel (Ni), neodymium (Nd), and copper (Cu).

The second interlayer insulating film ILD2 may cover the capacitor electrode CPE and the first interlayer insulating film ILD1. For example, the second interlayer insulating film ILD2 may include a contact hole through which the source electrode SE penetrates and a contact hole through which the drain electrode DE penetrates. Here, the contact hole of the second interlayer insulating film ILD2 may be connected to the contact hole of the first interlayer insulating film ILD1 and the contact hole of the gate insulating film GI.

The first passivation layer PAS1 may be provided on the thin film transistor TFT to protect the thin film transistor TFT. The first passivation layer PAS1 may include a contact hole through which the anode connection electrode ANDE1 penetrates. For example, the first passivation layer PAS1 may be formed as an organic film including an acrylic resin, an epoxy resin, a phenolic resin, a polyamide resin, or a polyimide resin, but embodiments are not limited thereto.

The anode connection electrode ANDE1 may be disposed on the first passivation layer PAS1. The anode connection electrode ANDE1 may be connected to the drain electrode DE of the thin film transistor TFT through a contact hole penetrating the first passivation layer PAS1. For example, the anode connection electrode ANDE1 may be formed as a single layer or multiple layers including at least one of molybdenum (Mo), aluminum (Al), chromium (Cr), gold (Au), titanium (Ti), nickel (Ni), neodymium (Nd), and copper (Cu).

The second passivation layer PAS2 may be provided on the first passivation layer PAS1 to cover the anode connection electrode ANDE1 and the first passivation layer PAS1. The second passivation layer PAS2 may include a contact hole through which the first electrode E1 of the light emitting element EL penetrates. Here, the contact hole of the second passivation layer PAS2 may be connected to the contact hole of the first passivation layer PAS1. For example, the second passivation layer PAS2 may be made of the materials used in forming the first passivation layer PAS1.

A light emitting element layer EML may be provided on the thin film transistor layer TFTL. The light emitting element layer EML may include a light emitting element EL and a pixel defining layer PDL. The light emitting element EL may include a first electrode E1, a light emitting layer E, and a second electrode E2.

The first electrode E1 may be provided on the second passivation layer PAS2. For example, the first electrode E1 may be disposed to overlap one of the first to third light emitting areas EA1 to EA3 defined by the pixel defining layer PDL. The first electrode E1 may be connected to the drain electrode DE of the thin film transistor TFT.

The light emitting layer E may be provided on the first electrode E1. The light emitting layer E may include a hole injection layer, a hole transport layer, a light receiving layer, an electron blocking layer, an electron transport layer, and an electron injection layer. For example, the light emitting layer E may be an organic light emitting layer including an organic material, but is not limited thereto. In the case where the light emitting layer E corresponds to an organic light emitting layer, when the thin film transistor TFT applies a predetermined voltage to the first electrode E1 of the light emitting element EL and the second electrode E2 of the light emitting element EL receives a common voltage or a cathode voltage, holes and electrons may move to the organic light emitting layer E through the hole transport layer and the electron transport layer, respectively, and the holes and the electrons may be combined with each other in the organic light emitting layer E to emit light.

The second electrode E2 may be provided on the light emitting layer E. For example, the second electrode E2 may be implemented in the form of a common electrode used for all pixels without being classified for each of the plurality of pixels. For example, the second electrode E2 may be disposed on the light emitting layer E in the first to third light emitting areas EA1 to EA3, and may be disposed on the pixel defining layer PDL in an area other than the first to third light emitting areas EA1 to EA3.

The pixel defining layer PDL may define first to third light emitting areas EA1 to EA3. The pixel defining layer PDL may separate and insulate the first electrodes E1 of each of the plurality of light emitting elements EL.

The encapsulation layer TFEL may be disposed on the second electrode E2 to cover the plurality of light emitting elements EL. The encapsulation layer TFEL may include at least one inorganic layer, and may prevent oxygen or moisture from penetrating the light emitting element layer EML. For example, the encapsulation layer TFEL may include at least one inorganic layer selected from a silicon nitride layer, a silicon oxy nitride layer, a silicon oxide layer, a titanium oxide layer, and an aluminum oxide layer. The encapsulation layer TFEL may include at least one organic layer to protect the light emitting element layer EML from foreign matter such as dust. For example, the encapsulation layer TFEL may include an acrylic resin, an epoxy resin, a phenolic resin, a polyamide resin, or a polyimide resin.

A sensing electrode layer SEL may be disposed on the encapsulation layer TFEL. The sensing electrode layer SEL may include a third buffer layer BF3, a connection electrode CE, a first insulating film SIL1, a driving electrode TE, a sensing electrode RE, and a second insulating film SIL2.

The third buffer layer BF3 may be disposed on the encapsulation layer TFEL. The third buffer layer BF3 may have insulating and optical functions. The third buffer layer BF3 may include at least one inorganic layer. For example, the third buffer layer BF3 may be formed as a multi-layer film in which at least one inorganic film of a silicon nitride layer, a silicon oxy nitride layer, a silicon oxide layer, a titanium oxide layer, and an aluminum oxide layer is alternately stacked. Optionally, the third buffer layer BF3 may be omitted.

The connection electrode CE may be disposed on the third buffer layer BF3. The connection electrode CE may be disposed in a different layer from the driving electrode TE and the sensing electrode RE to connect the driving electrodes TE adjacent to each other in the second direction (Y-axis direction). For example, the connection electrode CE may be formed as a single layer including molybdenum (Mo), titanium (Ti), copper (Cu), or aluminum (Al), or may be formed to have a stacked structure (Ti/Al/Ti) of aluminum and titanium, a stacked structure (ITO/Al/ITO) of aluminum and ITO, an APC alloy structure, or a stacked structure (ITO/APC/ITO) of APC alloy and ITO.

The first insulating film SIL1 may cover the connection electrode CE and the third buffer layer BF3. The first insulating film SIL1 may perform insulating and optical functions. For example, the first insulating film SIL1 may be formed of an inorganic layer such as a silicon nitride layer, a silicon oxy nitride layer, a silicon oxide layer, a titanium oxide layer, or an aluminum oxide layer.

The driving electrode TE and the sensing electrode RE may be disposed on the first insulating film SIL1. Each of the driving electrode TE and the sensing electrode RE may not overlap the first to third light emitting areas EA1 to EA3. Each of the driving electrode TE and the sensing electrode RE may be formed as a single layer including molybdenum (Mo), titanium (Ti), copper (Cu), or aluminum (Al), or may be formed to have a stacked structure (Ti/Al/Ti) of aluminum and titanium, a stacked structure (ITO/Al/ITO) of aluminum and ITO, an APC alloy structure, or a stacked structure (ITO/APC/ITO) of APC alloy and ITO.

The second insulating film STL2 may cover the driving electrode TE, the sensing electrode RE, and the first insulating film SIL1. The second insulating film STL2 may have insulating and optical functions. The second insulating film STL2 may be formed of the materials used in forming the first insulating film SIL1.

Figure 10:
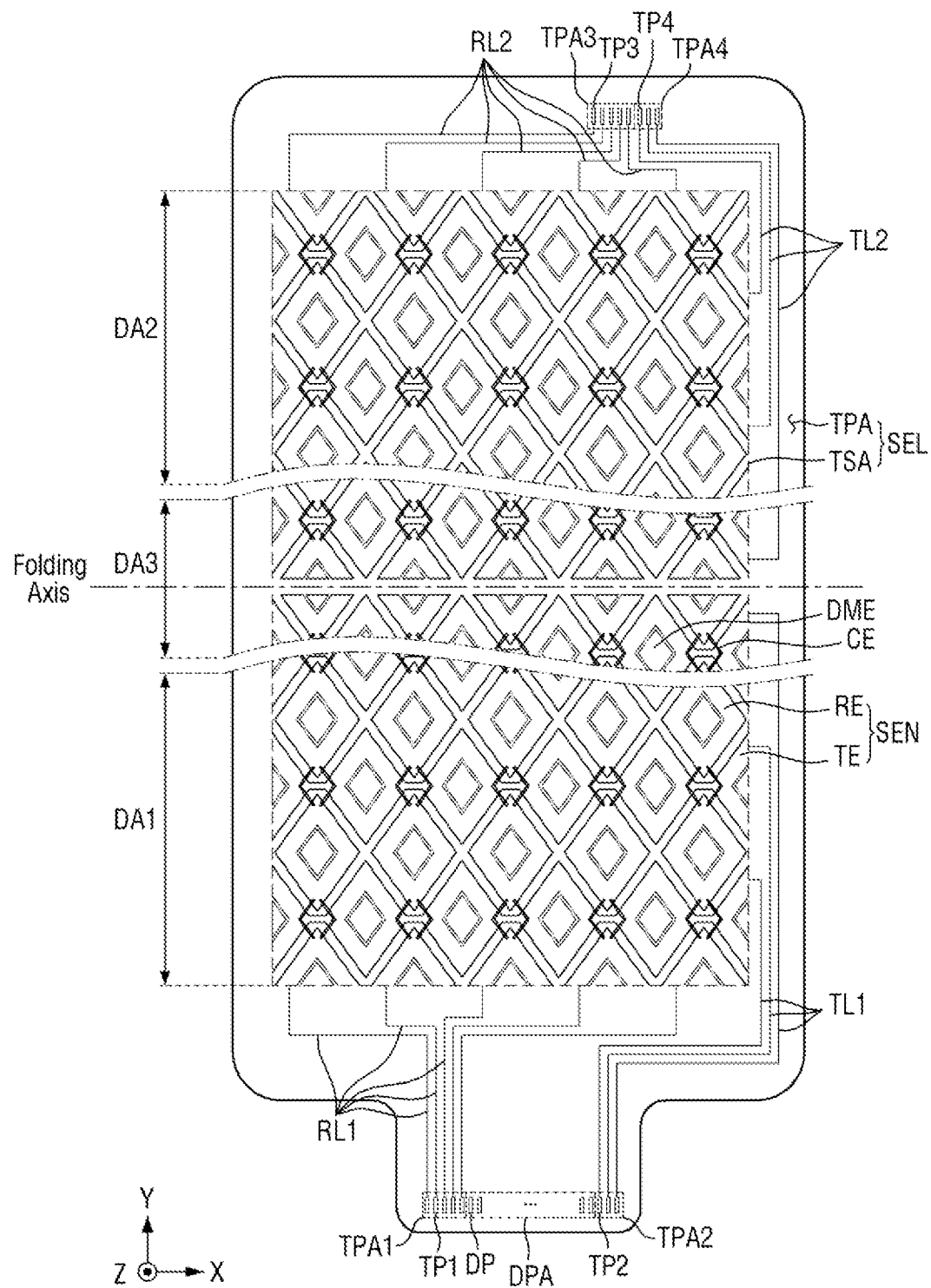
FIG. 10 is a plan view of another embodiment of the sensing electrode layer of the display device of FIG. 1.
Figure 11:
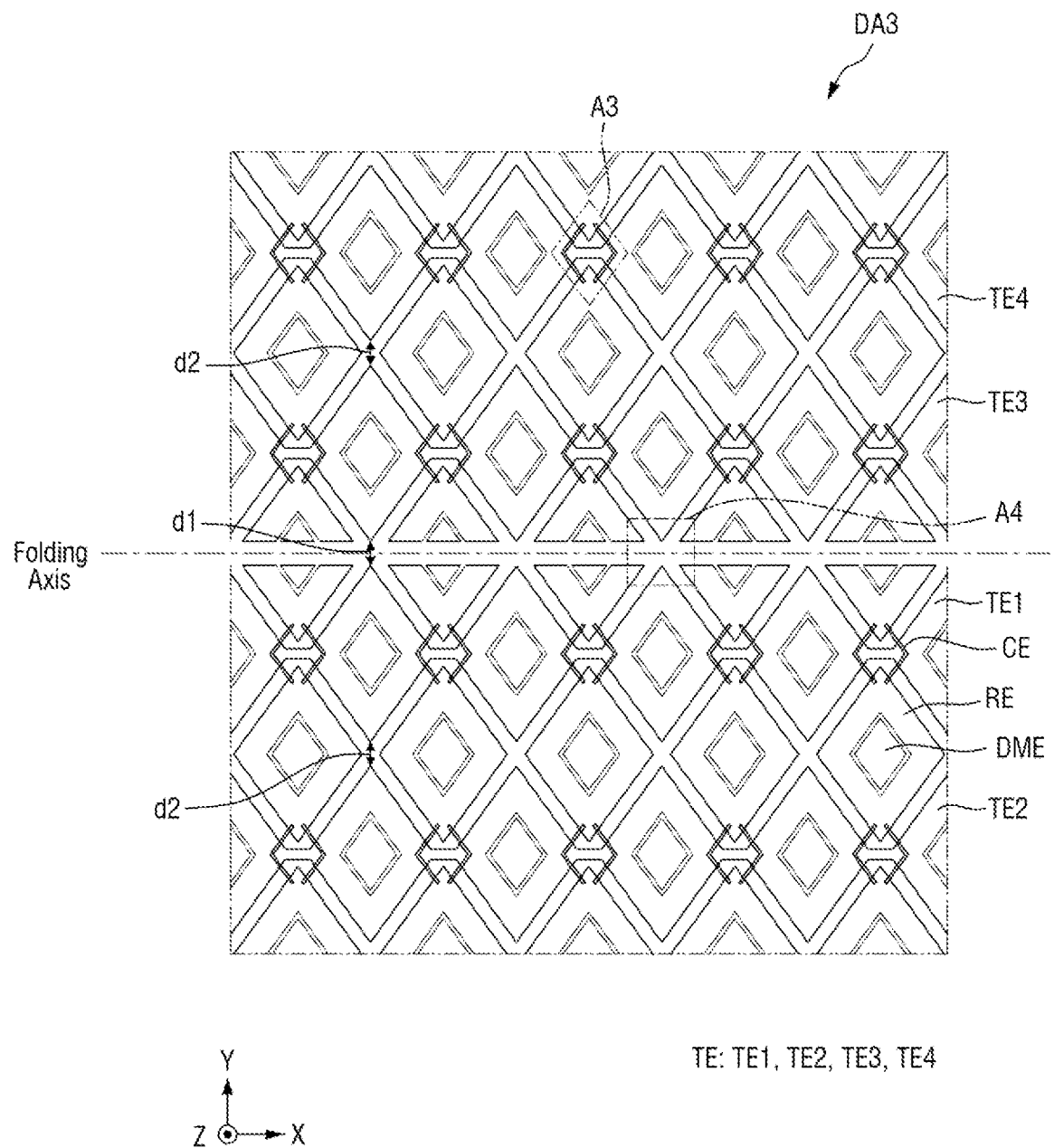
FIG. 11 is a plan view of the third display area of the display device of FIG. 10 illustrating the sensing electrode layer of FIG. 10.

FIG. 10 is a plan view of another embodiment of the sensing electrode layer of the display device of FIG. 1, and FIG. 11 is a plan view of the third display area of the display device of FIG. 1 illustrating the sensing electrode layer of FIG. 10. Hereinafter, the same components as those described above will be briefly described or omitted.

Referring to FIGS. 10 and 11, the sensing electrode layer SEL may include a touch sensor area TSA for sensing a user's touch, and a touch peripheral area TPA disposed around the touch sensor area TSA. The touch sensor area TSA may overlap the display area DA of the display layer DPL, and the touch peripheral area TPA may overlap the non-display area NDA of the display layer DPL.

The touch sensor area TSA may include a plurality of sensing electrodes SEN and a plurality of dummy patterns DME. The plurality of sensing electrodes SEN may form mutual capacitance to sense the touch of an object or a person. The plurality of sensing electrodes SEN may include a plurality of driving electrodes TE and a plurality of sensing electrodes RE. For example, the driving electrode TE may be defined as a first sensing electrode, and the sensing electrode RE may be defined as a second sensing electrode. For example, the driving electrode TE may be defined as a second sensing electrode, and the sensing electrode RE may be defined as a first sensing electrode.

The plurality of driving electrodes TE may extend in the first direction (X-axis direction) and may be spaced apart from each other in the second direction (Y-axis direction). The plurality of driving electrodes TE may be arranged in the first direction (X-axis direction) and the second direction (Y-axis direction), and the driving electrodes TE adjacent to each other in the first direction (X-axis direction) may be electrically connected through a connection electrode CE.

Among the plurality of driving electrodes TE, some driving electrodes TE disposed on one side of the folding axis may be connected to a second touch pad unit TP2 through a first driving line TL1. For example, some of the driving electrodes TE may be electrically connected along the first direction (X-axis direction) from the left side of the display area DA to the right side of the display area DA, and the driving electrodes TE disposed at the other end adjacent to one end of the display area DA may be connected to the first driving line TL1. Here, the other end adjacent to one end of the display area DA may be the right end of the display area DA disposed on one side of the folding axis. The first driving line TL1 may connect the driving electrodes TE disposed at the right end of the display area DA on one side of the folding axis and the second touch pad unit TP2 disposed at one side of the display panel 100. The first driving line TL1 may extend to the second touch pad unit TP2 disposed in the sub-area SBA via the right and lower sides of the touch peripheral area TPA. The second touch pad unit TP2 may be adjacent to the first touch pad unit TP1 or the display pad unit DP, and may be connected to the first touch driver 230 through the circuit board 210.

Among the plurality of driving electrodes TE, other driving electrodes TE disposed on the other side of the folding axis may be connected to a fourth touch pad unit TP4 through a second driving line TL2. For example, others of the driving electrodes TE may be electrically connected along the first direction (X-axis direction) from the left side of the display area DA to the right side of the display area DA, and the driving electrodes TE disposed at the other end adjacent to another end of the display area DA may be connected to the second driving line TL2. Here, the other end adjacent to another end of the display area DA may be the right end of the display area DA disposed on the other side of the folding axis. The second driving line TL2 may connect the driving electrodes TE disposed at the right end of the display area DA on the other side of the folding axis and the fourth touch pad unit TP4 disposed at the other side of the display panel 100. The second driving line TL2 may extend to the fourth touch pad unit TP4 disposed at the upper side of the touch peripheral area TPA via the right side of the touch peripheral area TPA. The fourth touch pad unit TP4 may be adjacent to the third touch pad unit TP3, and may be connected to the second touch driver 240 through the flexible film 250.

The plurality of sensing electrodes RE may be arranged in the first direction (X-axis direction) and the second direction (Y-axis direction). The plurality of sensing electrodes RE may be spaced apart from each other in the first direction (X-axis direction) and the second direction (Y-axis direction). The sensing electrodes RE adjacent in the second direction (Y-axis direction) may be electrically connected through a connection portion.

Among the plurality of sensing electrodes, some sensing electrodes RE disposed on one side of the folding axis may be connected to the first touch pad unit TP1 through a first sensing line RL1. For example, some of the sensing electrodes RE may be electrically connected along the second direction (Y-axis direction) from one side of the folding axis disposed in the third display area DA3 to one end of the first display area DA1, and the sensing electrodes RE disposed at one end of the first display area DA1 may be connected to the first sensing line RL1. Here, one end of the first display area DA1 may correspond to one end of the display panel 100. The first sensing line RL1 may connect the sensing electrodes RE disposed at one end of the first display area DA1 and the first touch pad unit TP1 disposed at one side of the display panel 100. The first touch pad unit TP1 may be connected to the first touch driver 230 through the circuit board 210.

Among the plurality of sensing electrodes, other sensing electrodes RE disposed on the other side of the folding axis may be connected to the third touch pad unit TP3 through a second sensing line RL2. For example, others of the sensing electrodes RE may be electrically connected along the second direction (Y-axis direction) from the other side of the folding axis disposed in the third display area DA3 to the other end of the second display area DA2, and the sensing electrodes RE disposed at the other end of the second display area DA2 may be connected to the second sensing line RL2. Here, the other end of the second display area DA2 may correspond to the other end of the display panel 100. The second sensing line RL2 may connect the sensing electrodes RE disposed at the other end of the second display area DA2 and the third touch pad unit TP3 disposed at the other side of the display panel 100. The third touch pad unit TP3 may be connected to the second touch driver 240 through the flexible film 250.

The connection electrode CE may be bent at least once. For example, the connection electrode CE may have an angled shape ("<" or ">") in a plan view, but the shape of the connection electrode CE is not limited thereto. The sensing electrodes RE adjacent to each other in the second direction (Y-axis direction) may be connected by the plurality of connection electrodes CE, and may be stably connected through the residual connection electrodes CE even when any one of the connection electrodes CE is disconnected. The sensing electrodes RE adjacent to each other may be connected by two connection electrodes CE, but the number of connection electrodes CE is not limited thereto.

The connection electrode CE may be disposed in a different layer from the plurality of driving electrodes TE and the plurality of sensing electrodes RE. The driving electrodes TE adjacent to each other in the first direction (X-axis direction) may be electrically connected through a connection portion disposed on the same layer as the plurality of driving electrodes TE or the plurality of sensing electrodes RE, and the sensing electrodes RE adjacent to each other in the second direction (Y-axis direction) may be electrically connected through the connection electrode CE disposed in a different layer from the plurality of driving electrodes TE or the plurality of sensing electrodes RE. Therefore, even when the connecting portion of the plurality of driving electrodes TE and the connecting electrode CE overlap each other in the third direction (Z-axis direction), the plurality of driving electrodes TE may be insulated from the plurality of sensing electrodes RE. Accordingly, mutual capacitance may be formed between the driving electrode TE and the sensing electrode RE.

Each of the plurality of dummy patterns DME may be surrounded by the driving electrode TE or the sensing electrode RE. Each of the plurality of dummy patterns DME may be spaced apart from and insulated from the driving electrode TE or the sensing electrode RE. Accordingly, the dummy pattern DME may be electrically floated.

The first driving line TL1 may supply touch driving signals supplied from the first touch driver 230 to the plurality of driving electrodes TE disposed on one side of the folding axis, and the second driving line TL2 may supply touch driving signals supplied from the second touch driver 240 to the plurality of driving electrodes TE disposed on the other side of the folding axis. Accordingly, among the plurality of driving electrodes TE, some driving electrodes TE may receive touch driving signals from the first touch driver 230, and other driving electrodes TE may receive touch driving signals from the second touch driver 240, thereby reducing the resistance-capacitance (RC) relay of the touch driving signal. Consequently, in the display device 10, the occurrence of a difference between the touch driving signal applied to the driving electrodes TE disposed at one side of the touch sensor area TSA and the touch driving signal applied to the driving electrodes TE disposed at the other side of the touch sensor area TSA may be prevented, thereby improving touch sensitivity.

Further, in the display device 10, the display layer DPL and the sensing electrode layer SEL may be provided in the third display area DA3 that is folded along the folding axis, so that the display layer DPL of the third display area DA3 may display an image, and the sensing electrode layer SEL of the third display area DA3 may detect a touch.

The display pad area DPA, the first touch pad area TPA1, and the second touch pad area TPA2 may be disposed at one side of the display panel 100. The display pad area DPA, the first touch pad area TPA1, and the second touch pad area TPA2 may be disposed in the sub-area SBA. The display pad area DPA, the first touch pad area TPA1, and the second touch pad area TPA2 may be electrically connected to the circuit board 210 through an anisotropic conductive film or a low-resistance high-reliability material such as a self assembly anisotropic conductive paste (SAP).

The display pad area DPA may include a plurality of display pad units DP. The plurality of display pad units DP may be connected to the main processor through the circuit board 210. The plurality of display pad units DP may be connected to the circuit board 210 to receive digital video data and supply the digital video data to the display driver 220.

The first touch pad area TPA1 may be disposed at one side of the display pad area DPA, and may include a plurality of first touch pad units TP1. The plurality of first touch pad units TP1 may be electrically connected to the first touch driver 230 disposed on the circuit board 210. The first touch driver 230 may detect a change in mutual capacitance between the driving electrode TE and the sensing electrode RE through the plurality of first sensing lines RL1 connected to the plurality of first touch pad units TP1.

The second touch pad area TPA2 may be disposed at the other side of the display pad area DPA, and may include a plurality of second touch pad units TP2. The plurality of second touch pad units TP2 may be electrically connected to the first touch driver 230 disposed on the circuit board 210. The plurality of second touch pad units TP2 may supply touch driving signals to the driving electrodes TE disposed on one side of the folding axis through the plurality of first driving lines TL1.

The third touch pad area TPA3 may include a plurality of third touch pad units TPA3. The plurality of third touch pad units TP3 may be electrically connected to the second touch driver 240 disposed on the flexible film 250. The second touch driver 240 may detect a change in mutual capacitance between the driving electrode TE and the sensing electrode RE through the plurality of second sensing lines RL2 connected to the plurality of third touch pad units TP3.

The fourth touch pad area TPA4 may include a plurality of fourth touch pad units TP4. The plurality of fourth touch pad units TP4 may be electrically connected to the second touch driver 240 disposed on the flexible film 250. The plurality of fourth touch pad units TP4 may supply touch driving signals to the driving electrodes TE disposed on the other side of the folding axis through the plurality of second driving lines TL2.

The plurality of driving electrodes TE may include first to fourth driving electrodes DE1 to DE4. The first driving electrode TE1 may disposed on one side of the folding axis and be closest to the folding axis, and the second driving electrode TE2 may be disposed at one side of the first driving electrode TE1. The third driving electrode TE3 may disposed on the other side of the folding axis and be closest to the folding axis, and the fourth driving electrode TE4 may be disposed at the other side of the third driving electrode TE3. The folding axis may be disposed between the first and second driving electrodes TE1 and TE2 and may extend in a direction substantially parallel to each of the first to fourth driving electrodes TE1 to TE4.

For example, the first distance d1 between the first driving electrode TE1 and the third driving electrode TE3 may be substantially equal to the second distance d2 between the first driving electrode TE1 and the second driving electrode TE2. The first distance d1 between the first driving electrode TE1 and the third driving electrode TE3 may be substantially equal to the second distance d2 between the first driving electrode TE1 and the second driving electrode TE2. Therefore, even when the folding axis is disposed between the first and second driving electrodes TE1 and TE2, the first to fourth driving electrodes TE1 to TE4 may be arranged at substantially the same intervals.

The size of the sensing electrode RE disposed between the first driving electrode TE1 and the folding axis may be half of or less than the size of the sensing electrode RE disposed between the first and second driving electrodes TE1 and TE2. The size of the sensing electrode RE disposed between the third driving electrode TE3 and the folding axis may be half of or less than the size of the sensing electrode RE disposed between the third and fourth driving electrodes TE3 and TE4. For example, the sum of the size of the sensing electrode RE disposed between the first driving electrode TE1 and the folding axis and the size of the sensing electrode RE disposed between the third driving electrode TE3 and the folding axis may be smaller than the size of the sensing electrode RE disposed between the first and second driving electrodes TE1 and TE2 by the sum (e.g., the first distance d1) of a thickness of the folding axis and intervals between the folding axis and the sensing electrodes RE. Accordingly, the plurality of sensing electrodes RE may be arranged at substantially the same intervals, except for the sensing electrodes RE directly facing the folding axis.

The facing area of the plurality of sensing electrodes RE spaced apart from each other and adjacent to the folding axis interposed therebetween face each other may be larger than the facing area of the plurality of driving electrodes TE spaced from each other and adjacent to the folding axis interposed therebetween face each other. Accordingly, the plurality of sensing electrodes RE facing each other with the folding axis interposed therebetween may have a shape that is formed through cutting the sensing electrode RE of the first display area DA1 or the second display area DA2 by the folding axis.

Accordingly, the display device 10 includes the connecting electrode CE connecting the plurality of driving electrodes TE extending in the first direction (X-axis direction) and the plurality of sensing electrodes RE adjacent in the second direction (Y-axis direction), thereby preventing the electrical interference between the driving electrode TE disposed on one side of the folding axis and the sensing electrode RE disposed on the other side of the folding axis and preventing the electrical interference between the driving electrode TE disposed on the other side of the folding axis and the sensing electrode RE disposed on one side of the folding axis.

Figure 12:
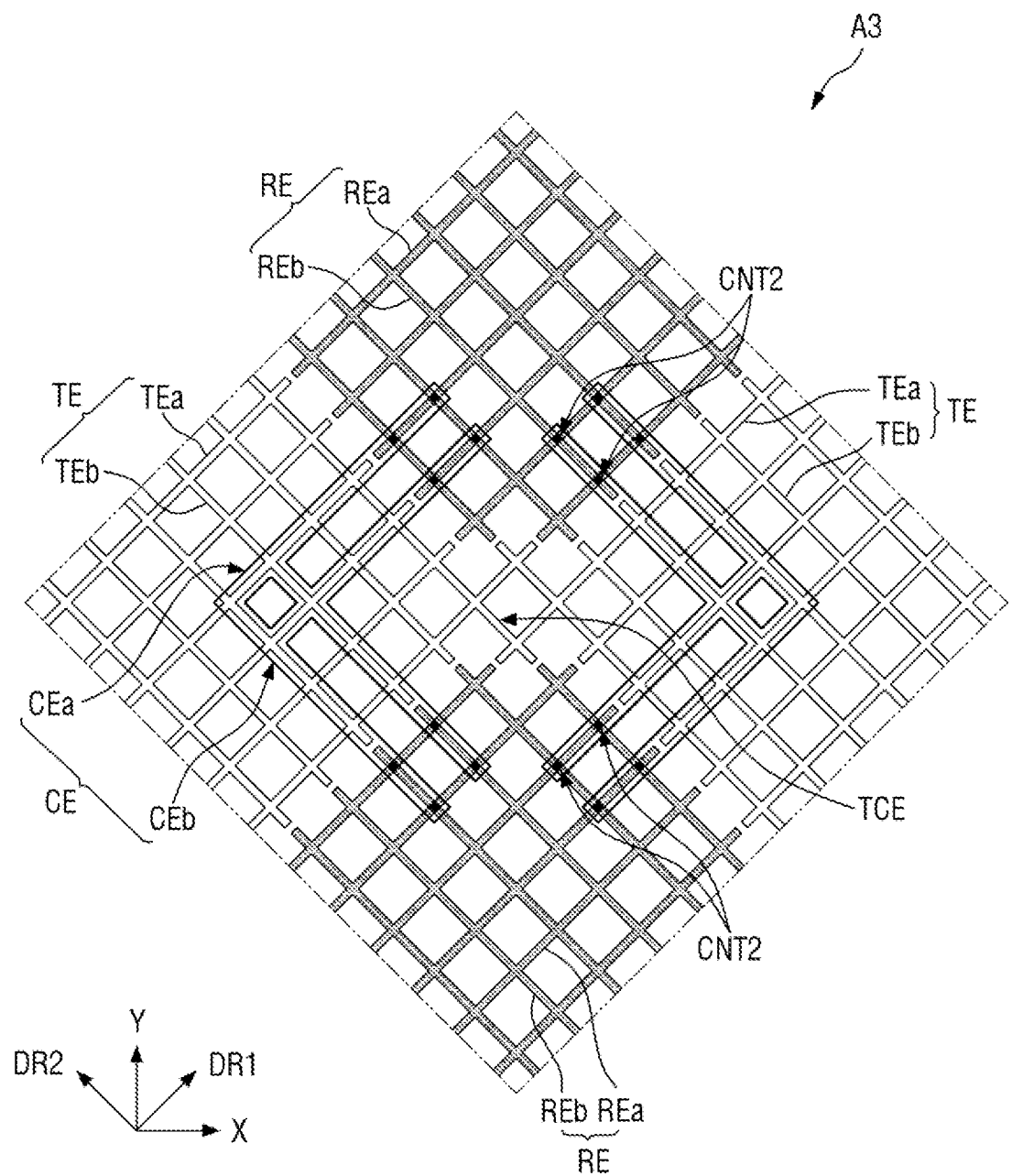
FIG. 12 is an enlarged view of area A3 in FIG. 11.
Figure 13:
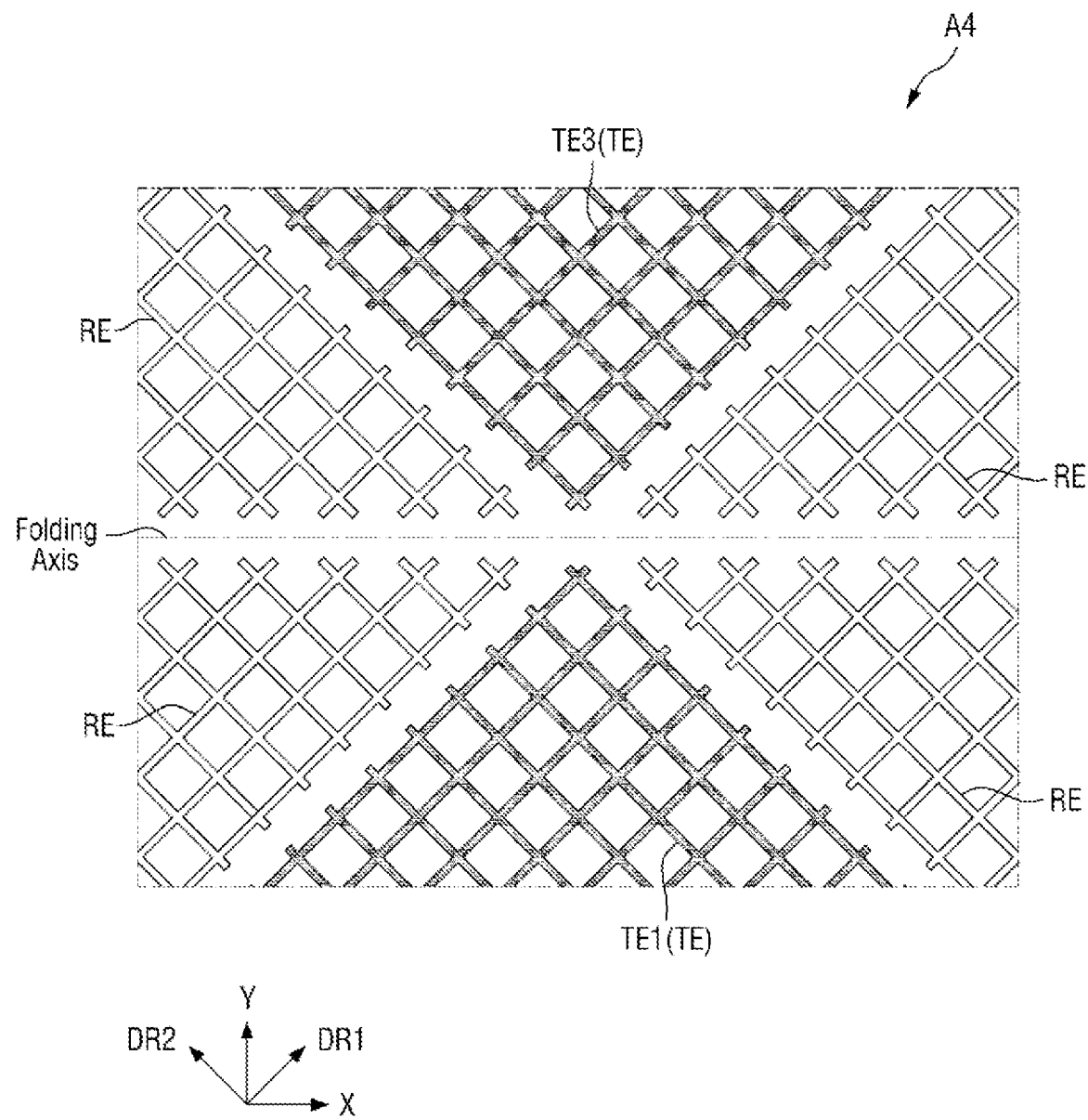
FIG. 13 is an enlarged view of area A4 in FIG. 11.
Figure 14:
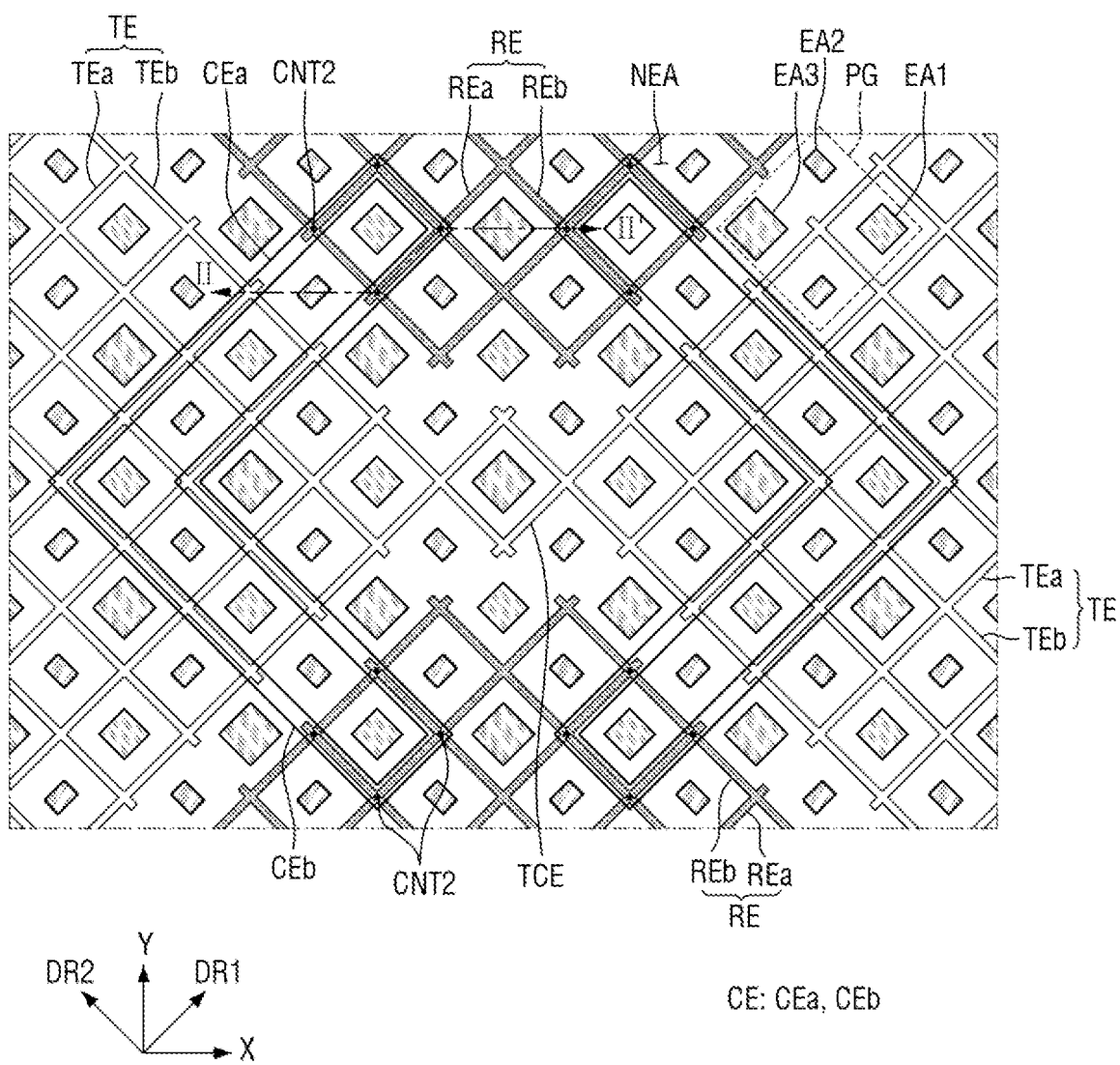
FIG. 14 is a plan view of another embodiment of the display layer and the sensing electrode layer of the display device of FIG. 1.

FIG. 12 is an enlarged view of area A3 in FIG. 11, FIG. 13 is an enlarged view of area A4 in FIG. 11, and FIG. 14 is a plan view of another embodiment of the display layer and the sensing electrode layer of the display device of FIG. 1. Hereinafter, the same components as those described above will be briefly described or omitted for descriptive convenience.

Referring to FIGS. 12 to 14, the plurality of driving electrodes TE, the plurality of sensing electrodes RE, and the plurality of dummy patterns DME may be disposed on the same layer, and may be spaced apart from each other. Accordingly, a plurality of gaps GAP may be formed between the driving electrode TE and the sensing electrode RE, may be formed between the driving electrode TE and the dummy pattern DME, and may be formed between the sensing electrode RE and the dummy pattern DME.

The plurality of driving electrodes TE may extend in the first direction (X-axis direction) and may be spaced apart from each other in the second direction (Y-axis direction). The plurality of driving electrodes TE may be arranged in the first direction (X-axis direction) and the second direction (Y-axis direction), and the driving electrodes TE adjacent in the first direction (X-axis direction) may be electrically connected through the connection electrode CE. For example, the connection portion TCE of the driving electrodes TE may be disposed between the sensing electrodes RE adjacent to each other. For example, the connection portion TCE of the driving electrodes TE may be disposed in an area where the sensing electrodes RE adjacent to each other have the shortest distance from each other.

The plurality of sensing electrodes RE may be arranged in the first direction (X-axis direction) and the second direction (Y-axis direction). The plurality of sensing electrodes RE may be spaced apart from each other in the first direction (X-axis direction) and the second direction (Y-axis direction). The sensing electrodes RE adjacent in the second direction (Y-axis direction) may be electrically connected through the connection electrode CE.

The connection electrode CE may be bent at least once. For example, the connection electrode CE may have an angled shape ("<" or ">") in a plan view, but the shape of the connection electrode CE is not limited thereto. The sensing electrodes RE adjacent to each other in the second direction (Y-axis direction) may be connected by the plurality of connection electrodes CE, and may be stably connected through the residual connection electrodes CE even when any one of the connection electrodes CE is disconnected. The sensing electrodes RE adjacent to each other may be connected by two connection electrodes CE, but the number of connection electrodes CE is not limited thereto.

The plurality of connection electrodes CE may be disposed in a different layer from the driving electrode TE and the sensing electrode RE. The connection electrode CE may include a first portion CEa and a second portion CEb. For example, the second portion CEb of the connection electrode CE may be connected to the sensing electrode RE disposed at one side thereof through the second contact hole CNT2 and may extend in the second diagonal direction DR2. The first portion CEa of the connection electrode CE may be bent from the second portion CEb in an area overlapping the driving electrode TE and may extend in the first diagonal direction DR1, and may be connected to the sensing electrode RE disposed at the other side thereof through the second contact hole CNT2. Accordingly, each of the plurality of connection electrodes CE may connect the sensing electrodes RE adjacent in the second direction (Y-axis direction).

For example, the plurality of driving electrodes TE, the plurality of sensing electrodes RE, and the plurality of dummy patterns DME may be formed in a mesh structure or a network structure in a plan view. Therefore, the plurality of driving electrodes TE, the plurality of sensing electrodes RE, and the plurality of dummy patterns DME may not overlap first to third light emitting areas EA1 to EA3 of a pixel group PG. The plurality of connection electrodes CE may also not overlap the first to third light emitting areas EA1 to EA3. Accordingly, the display device 10 may prevent the luminance of light emitted from the first to third light emitting areas EA1 to EA3 from being reduced by the sensing electrode layer SEL.

Each of the driving electrodes TE may include a first portion TEa extending in the first diagonal direction DR1 and a second portion TEb extending in the second diagonal direction DR2. Each of the plurality of sensing electrodes RE may include a first portion REa extending in the first diagonal direction DR1 and a second portion REb extending in the second diagonal direction DR2.

For example, the plurality of driving electrodes TE, the plurality of sensing electrodes RE, and the plurality of dummy patterns DME may be formed in an entire surface structure, not in a mesh structure or a network structure, in a plan view. In this case, the plurality of driving electrodes TE, the plurality of sensing electrodes RE, and the plurality of dummy patterns DME may include a transparent conductive material having high light transmittance, such as ITO and IZO, and may prevent the luminance of light emitted from the first to third light emitting areas EA1 to EA3 from being reduced.

The plurality of pixels may include first to third sub-pixels, and each of the first to third sub-pixels may include first to third light emitting areas EA1 to EA3.

Figure 15:
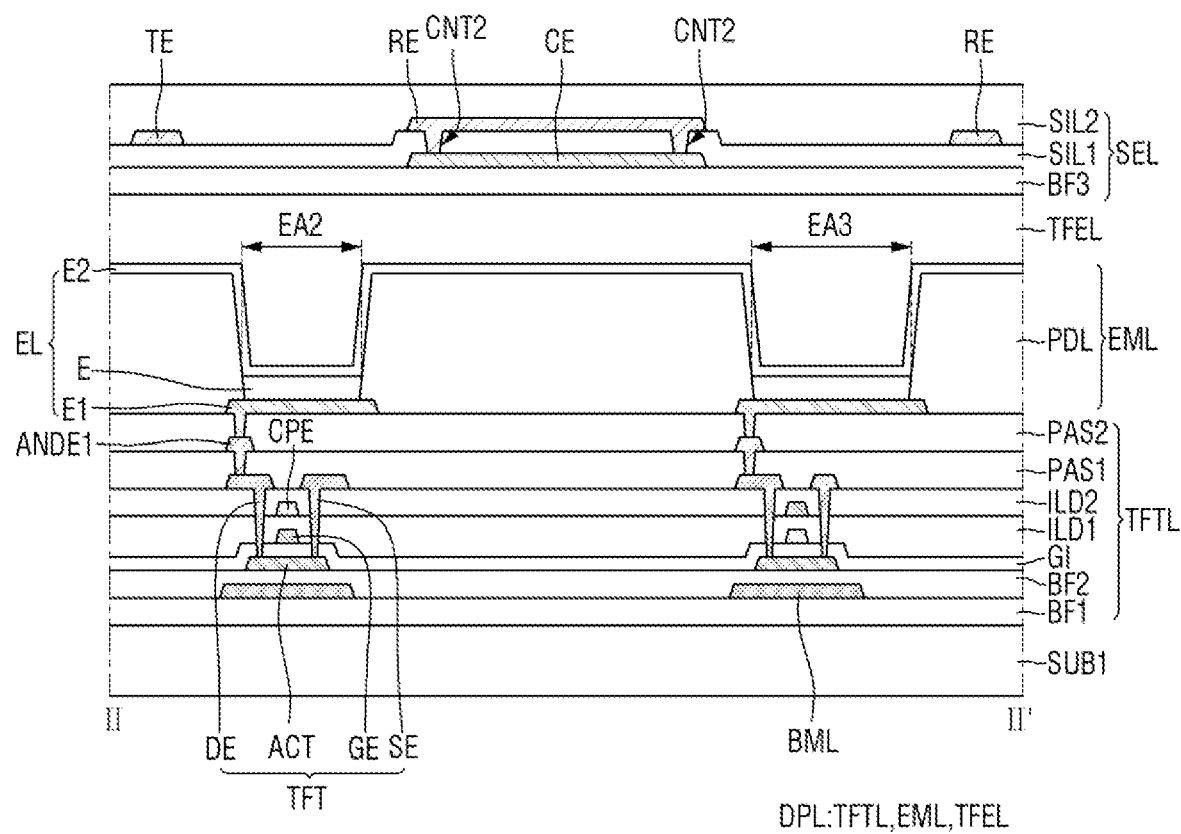
FIG. 15 is a cross-sectional view taken along the line II-II' of FIG. 14.

FIG. 15 is a cross-sectional view taken along the line II-II' of FIG. 14. The display device of FIG. 16 is different from the display device of FIG. 9 in the configuration of the sensing electrode layer SEL. The same components as those described above will be briefly described or omitted for descriptive convenience for descriptive convenience.

Referring to FIG. 15, the display device 10 may include a first base member SUB1, a thin film transistor layer TFTL, a light emitting element layer EML, an encapsulation layer TFEL, and a sensing electrode layer SEL.

The sensing electrode layer SEL may be disposed on the encapsulation layer TFEL. The sensing electrode layer SEL may include a third buffer layer BF3, a connection electrode CE, a first insulating film SIL1, a driving electrode TE, a sensing electrode RE, and a second insulating film SIL2.

The third buffer layer BF3 may be disposed on the encapsulation layer TFEL. The third buffer layer BF3 may have insulating and optical functions.

The connection electrode CE may be disposed on the third buffer layer BF3. The connecting electrode CE is disposed in a different layer from the driving electrode TE and the sensing electrode RE to connect the sensing electrodes RE adjacent to each other in the second direction (Y-axis direction).

The first insulating film SIL1 may cover the connection electrode CE and the third buffer layer BF3. The first insulating film SIL1 may have insulating and optical functions.

The driving electrode TE and the sensing electrode RE may be disposed on the first insulating film SIL1. Each of the driving electrode TE and the sensing electrode RE may not overlap the first to third light emitting areas EA1 to EA3.

The second insulating film SIL2 may cover the driving electrode TE, the sensing electrode RE, and the first insulating film SIL1. The second insulating film STL2 may have insulating and optical functions. The second insulating film STL2 may be made of the materials used in forming the first insulating film SIL1.

According to a display device of embodiments, some driving electrodes disposed at one side of a folding axis are driven by a first touch driver, other driving electrodes disposed at the other side of the folding axis are driven by a second touch driver, and metal lines are provided between the some driving electrodes and the other driving electrodes, thereby preventing the electrical interference between the plurality of driving electrodes and the plurality of sensing electrodes arranged on both sides of the folding axis and improving the touch sensitivity of the plurality of sensing electrodes.

According to a display device of embodiments, among the plurality of driving electrodes extending in a direction substantially parallel to the folding axis, some driving electrodes disposed at one side of the folding axis are driven by a first touch driver, other driving electrodes disposed at the other side of the folding axis are driven by a second touch driver, and metal lines are provided between some driving electrodes and other driving electrodes, thereby preventing the electrical interference between the plurality of driving electrodes and the plurality of sensing electrodes arranged on both sides of the folding axis and improving the touch sensitivity of the plurality of sensing electrodes.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a first base layer foldable along a folding axis and comprising a display area including a first display area disposed on one side of the folding axis, a second display area disposed on another side of the folding axis, and a third display area through which the folding axis passes;
a plurality of first sensing electrodes and a plurality of second sensing electrodes disposed in each of the first display area, the second display area, and the third display area on the first base layer;
a first sensing line connected to the plurality of second sensing electrodes disposed at a first end of the first display area;
a second sensing line connected to the plurality of second sensing electrodes disposed at a second end of the second display area;
a first driving line disposed at a third end adjacent to the first end of the first display area and connected to the plurality of first sensing electrodes disposed on the one side of the folding axis;
a second driving line disposed at a fourth end adjacent to the second end of the second display area and connected to the plurality of first sensing electrodes disposed on the another side of the folding axis; and
a metal line overlapping the folding axis and extending across the third display area, and being connected to a ground pad unit disposed at one side of the first base layer,
wherein each of the plurality of first sensing electrodes and each of the plurality of second sensing electrodes are spaced apart from each other based on the folding axis interposed therebetween.

2. The display device of claim 1, wherein the first base layer further comprises:
a first pad unit disposed at one side of the first base layer and connected to each of the plurality of first sensing electrodes and each of the plurality of second sensing electrodes arranged on one side of the folding axis; and
a second pad unit disposed at another side of the first base layer and connected to each of the plurality of first sensing electrodes and each of the plurality of second sensing electrodes arranged on another side of the folding axis.

3. The display device of claim 2, further comprising:
a first touch driver connected to the first pad unit to drive the plurality of first sensing electrodes and the plurality of second sensing electrodes connected to the first pad unit; and
a second touch driver connected to the second pad unit to drive the plurality of first sensing electrodes and the plurality of second sensing electrodes connected to the second pad unit.

4. The display device of claim 2, wherein the plurality of first sensing electrodes extend in a first direction and are spaced apart from each other in a second direction substantially perpendicular to the first direction, and the plurality of second sensing electrodes are spaced apart from each other in the first direction and the second direction.

5. The display device of claim 4, further comprising:
a connection electrode disposed in a different layer from the plurality of first sensing electrodes and the plurality of second sensing electrodes and connecting the plurality of second sensing electrodes spaced apart from each other in the second direction.

6. The display device of claim 4, wherein the first sensing line connects the plurality of second sensing electrodes to the first pad unit,
the second sensing line connects the plurality of second sensing electrodes to the second pad unit;
the first driving line connects the plurality of first sensing electrodes to the first pad unit; and
the second driving line connects the plurality of first sensing electrodes to the second pad unit.

7. The display device of claim 4, wherein a facing area of the plurality of second sensing electrodes spaced apart from each other and adjacent to the folding axis interposed therebetween is larger than a facing area of the plurality of first sensing electrodes spaced apart from each other and adjacent to the folding axis interposed therebetween.

8. The display device of claim 4, wherein the plurality of first sensing electrodes comprises:
a first driving electrode disposed on the one side of the folding axis and closest to the folding axis;
a second driving electrode disposed at one side of the first driving electrode; and
a third driving electrode disposed on the another side of the folding axis and closest to the folding axis,
wherein a distance between the first driving electrode and the second driving electrode is substantially equal to a distance between the first driving electrode and the third driving electrode.

9. The display device of claim 2, further comprising:
a display layer including a plurality of pixels arranged in the display area on the first base layer; and
a sensing electrode layer including the plurality of first sensing electrodes and the plurality of second sensing electrodes on the display layer.

10. The display device of claim 9, further comprising:
a circuit board connected to the first pad unit disposed at the one side of the first base layer;
a first touch driver disposed on the circuit board and connected to the first pad unit;
a flexible film connected to the second pad unit disposed at the another side of the first base layer; and
a second touch driver disposed on the flexible film and connected to the second pad unit.

11. The display device of claim 2, further comprising:
a display layer including a plurality of pixels arranged in the display area on the first base layer;
a second base layer covering the display layer;
an adhesive layer disposed at edges of the first base layer and the second base layer to surround the display layer; and
a sensing electrode layer including the plurality of first sensing electrodes and the plurality of second sensing electrodes on the second base layer.

12. The display device of claim 11, further comprising:
a circuit board connected to the first pad unit disposed at the one side of the first base layer;

a first touch driver disposed on the circuit board and connected to the first pad unit;

a flexible film connected to the second pad unit disposed at one side of the second base layer; and a second touch driver disposed on the flexible film and connected to the second pad unit.

13. The display device of claim 1, further comprising:
a dummy pattern surrounded by the plurality of first sensing electrodes or the plurality of second sensing electrodes and insulated from the plurality of first sensing electrodes and the plurality of second sensing electrodes.

14. A display device, comprising:
a first base layer foldable along a folding axis and comprising a display area including a first display area disposed on one side of the folding axis, a second display area disposed on another side of the folding axis, and a third display area through which the folding axis passes; and
a plurality of first sensing electrodes and a plurality of second sensing electrodes disposed in each of the first display area, the second display area, and the third display area on the first base layer;
wherein each of the plurality of first sensing electrodes and each of the plurality of second sensing electrodes are spaced apart from each other based on the folding axis interposed therebetween,
wherein the third display area includes a metal line overlapping the folding axis and extending across the third display area, and being connected to a ground pad unit disposed at one side of the first base layer.

15. The display device of claim 14, wherein the plurality of first sensing electrodes are spaced apart from each other in a first direction and a second direction substantially perpendicular to the first direction, and the plurality of second sensing electrodes extend in the first direction and are spaced apart from each other in the second direction.

16. The display device of claim 15, further comprising:
a connection electrode disposed in a different layer from the plurality of first sensing electrodes and the plurality of second sensing electrodes and connecting the plurality of first sensing electrodes spaced apart from each other in the second direction.

17. The display device of claim 15, further comprising:
a first driving line connecting the plurality of first sensing electrodes disposed at a first end of the display area to the first pad unit;
a second driving line connecting the plurality of first sensing electrodes disposed at a second end of the display area to the second pad unit;
a first sensing line disposed at a third end adjacent to the first end of the display area and connecting the plurality of second sensing electrodes disposed on the one side of the folding axis to the first pad unit; and
a second sensing line disposed at a fourth end adjacent to the second end of the display area and connecting the plurality of second sensing electrodes disposed on the another side of the folding axis to the second pad unit.

18. The display device of claim 17, wherein the metal line is disposed between the plurality of first sensing electrodes connected to the first driving line and the plurality of first sensing electrodes connected to the second driving line.

19. The display device of claim 15, wherein a facing area of the plurality of first sensing electrodes spaced apart from each other and adjacent to the folding axis interposed therebetween is larger than a facing area of the plurality of second sensing electrodes spaced apart from each other and adjacent to the folding axis interposed therebetween.

20. The display device of claim 15, wherein the plurality of second sensing electrodes comprises:
a second-first sensing electrode disposed on the one side of the folding axis and closest to the folding axis;
a second-second sensing electrode disposed at one side of the second-first sensing electrode; and
a second-third sensing electrode disposed on the another side of the folding axis and closest to the folding axis,
wherein a distance between the second-first sensing electrode and the second-second sensing electrode is substantially equal to a distance between the second-first sensing electrode and the second-third sensing electrode.

* * * * *